(12) United States Patent
White et al.

(10) Patent No.: US 9,330,222 B2
(45) Date of Patent: May 3, 2016

(54) METHODS, SYSTEMS, AND ARTICLES OF MANUFACTURE FOR IMPLEMENTING ELECTRONIC CIRCUIT DESIGNS WITH ELECTRO-MIGRATION AWARENESS

(75) Inventors: David White, San Jose, CA (US); Michael McSherry, Portland, OR (US); Ed Fischer, Salem, OR (US); Bruce Yanagida, Snohomish, WA (US); Prakash Gopalakrishnan, Wayne, NJ (US)

(73) Assignee: Cadence Design Systems, Inc., San Jose, CA (US)

( * ) Notice: Subject to any disclaimer, the term of this patent is extended or adjusted under 35 U.S.C. 154(b) by 410 days.

(21) Appl. No.: 12/982,762

(22) Filed: Dec. 30, 2010

(65) Prior Publication Data
US 2012/0022846 A1    Jan. 26, 2012

Related U.S. Application Data

(60) Provisional application No. 61/367,398, filed on Jul. 24, 2010, provisional application No. 61/367,412, filed on Jul. 24, 2010, provisional application No. 61/367,404, filed on Jul. 24, 2010, provisional (Continued)

(51) Int. Cl.
G06F 17/50    (2006.01)

(52) U.S. Cl.
CPC ........ *G06F 17/5081* (2013.01); *G06F 17/5068* (2013.01); *G06F 17/5077* (2013.01)

(58) Field of Classification Search
CPC ............ G06F 17/5081; G06F 17/5068; G06F 17/5077
USPC .......... 703/14, 13; 716/123, 113, 10, 11, 100, 716/111, 115
See application file for complete search history.

(56) References Cited

U.S. PATENT DOCUMENTS

| 4,817,012 A | 3/1989 | Cali' |
|---|---|---|
| 5,469,366 A | 11/1995 | Yang et al. |

(Continued)

FOREIGN PATENT DOCUMENTS

| TW | 200405210 A | 4/2004 |
|---|---|---|
| TW | I262411 B | 9/2006 |

(Continued)

OTHER PUBLICATIONS

Chow, Karen et al. "Method for Maintaining Electromigration in SOC's When Designing for Both Reliability and Manufacturing", 2006, IEEE.*

(Continued)

*Primary Examiner* — Kamini S Shah
*Assistant Examiner* — Cedric D Johnson
(74) *Attorney, Agent, or Firm* — Vista IP Law Group, LLP

(57) ABSTRACT

Disclosed are methods, systems, and articles of manufacture for implementing electronic circuit designs with electro-migration awareness. Some embodiments perform schematic level simulation(s) to determine electrical characteristics, identifies physical parasitics of a layout component, determines the electrical or physical characteristics associated to electro-migration analysis on the component, and determines whether the component meets EM related constraint(s) while implementing the physical design of the electronic circuit in some embodiments. Some embodiments further determine adjustment(s) to the component or related data where the EM related constraints are not met and/or and present the adjustment(s) in the form of hints. Various data and information, such as currents in various forms or voltages, are passed between various schematic level tools and physical level tools.

51 Claims, 17 Drawing Sheets

Related U.S. Application Data application No. 61/367,406, filed on Jul. 24, 2010, provisional application No. 61/367,407, filed on Jul. 24, 2010, provisional application No. 61/367,410, filed on Jul. 24, 2010.

(56) References Cited

U.S. PATENT DOCUMENTS

| | | | |
|---|---|---|---|
| 5,553,002 | A | 9/1996 | Dangelo et al. |
| 5,629,857 | A | 5/1997 | Brennan |
| 5,801,958 | A | 9/1998 | Dangelo et al. |
| 5,872,952 | A * | 2/1999 | Tuan et al. ............... 714/724 |
| 5,999,726 | A | 12/1999 | Ho |
| 6,072,945 | A | 6/2000 | Aji et al. |
| 6,131,182 | A | 10/2000 | Beakes et al. |
| 6,378,110 | B1 | 4/2002 | Ho |
| 6,438,729 | B1 * | 8/2002 | Ho ................ G06F 17/5081 716/113 |
| 6,449,578 | B1 | 9/2002 | McBride |
| 6,470,482 | B1 | 10/2002 | Rostoker et al. |
| 6,499,130 | B1 * | 12/2002 | Lipton ............ G06F 17/5022 716/52 |
| 6,507,932 | B1 | 1/2003 | Landry et al. |
| 6,523,150 | B1 | 2/2003 | Buffet et al. |
| 6,539,533 | B1 | 3/2003 | Brown et al. |
| 6,553,554 | B1 | 4/2003 | Dahl et al. |
| 6,584,606 | B1 * | 6/2003 | Chiu et al. ............... 716/112 |
| 6,643,836 | B2 | 11/2003 | Wheeler et al. |
| 6,665,845 | B1 | 12/2003 | Aingaran et al. |
| 6,701,508 | B1 | 3/2004 | Bartz et al. |
| 6,842,714 | B1 | 1/2005 | Acar et al. |
| 6,877,148 | B1 * | 4/2005 | Hassibi et al. ............... 716/129 |
| 6,910,200 | B1 | 6/2005 | Aubel et al. |
| 6,954,915 | B2 | 10/2005 | Batchelor |
| 6,971,074 | B2 | 11/2005 | Hasegawa et al. |
| 6,981,238 | B1 | 12/2005 | Churchill |
| 7,016,794 | B2 | 3/2006 | Schultz |
| 7,020,853 | B2 | 3/2006 | Skoll et al. |
| 7,069,526 | B2 | 6/2006 | Schubert et al. |
| 7,076,410 | B1 | 7/2006 | Kerzman et al. |
| 7,089,129 | B2 | 8/2006 | Habitz |
| 7,152,215 | B2 | 12/2006 | Smith et al. |
| 7,159,202 | B2 | 1/2007 | Lee et al. |
| 7,178,118 | B2 | 2/2007 | Ramachandran et al. |
| 7,181,383 | B1 | 2/2007 | McGaughy et al. |
| 7,206,731 | B2 | 4/2007 | Sercu et al. |
| 7,228,514 | B2 | 6/2007 | Chan et al. |
| 7,243,317 | B2 | 7/2007 | Wang et al. |
| 7,249,340 | B2 | 7/2007 | Cooke et al. |
| 7,251,800 | B2 | 7/2007 | McElvain et al. |
| 7,278,120 | B2 | 10/2007 | Rahmat et al. |
| 7,331,029 | B2 | 2/2008 | Amit et al. |
| 7,347,621 | B2 | 3/2008 | Sri-Jayantha et al. |
| 7,356,784 | B1 | 4/2008 | Dengi et al. |
| 7,383,521 | B2 | 6/2008 | Smith et al. |
| 7,395,519 | B2 | 7/2008 | Kawata |
| 7,559,045 | B2 | 7/2009 | Chen et al. |
| 7,567,894 | B2 | 7/2009 | Durand et al. |
| 7,574,682 | B2 | 8/2009 | Riviere-Cazaux |
| 7,596,771 | B2 | 9/2009 | Cohen et al. |
| 7,640,527 | B1 | 12/2009 | Doraira et al. |
| 7,797,646 | B2 | 9/2010 | Chung et al. |
| 7,802,222 | B2 | 9/2010 | Arsintescu |
| 7,805,698 | B1 | 9/2010 | Ferguson et al. |
| 7,810,063 | B1 | 10/2010 | Sharma et al. |
| 7,818,697 | B2 | 10/2010 | Cho |
| 7,904,852 | B1 | 3/2011 | Cadouri et al. |
| 7,941,768 | B1 | 5/2011 | Wei |
| 7,966,588 | B1 | 6/2011 | Perry et al. |
| 8,141,013 | B2 | 3/2012 | Woods et al. |
| 8,150,638 | B1 | 4/2012 | Wu et al. |
| 8,185,856 | B2 | 5/2012 | Izuha |
| 8,224,636 | B2 | 7/2012 | Kundert |
| 8,261,228 | B1 | 9/2012 | Gopalakrishnan et al. |
| 2002/0166102 | A1 | 11/2002 | Du et al. |
| 2002/0188920 | A1 * | 12/2002 | Lampaert et al. ............... 716/10 |
| 2003/0131323 | A1 | 7/2003 | McConaghy |
| 2004/0049747 | A1 | 3/2004 | Yamasaki et al. |
| 2004/0078767 | A1 | 4/2004 | Burks et al. |
| 2004/0111688 | A1 | 6/2004 | Lee et al. |
| 2004/0117748 | A1 | 6/2004 | Tester |
| 2004/0117750 | A1 | 6/2004 | Skoll et al. |
| 2004/0128368 | A1 | 7/2004 | Sakai |
| 2004/0128638 | A1 | 7/2004 | Kerzman et al. |
| 2004/0143809 | A1 | 7/2004 | Cowan et al. |
| 2004/0243949 | A1 * | 12/2004 | Wang et al. ............... 716/4 |
| 2005/0010922 | A1 | 1/2005 | Czajkowski et al. |
| 2005/0114818 | A1 | 5/2005 | Khakzadi et al. |
| 2005/0216873 | A1 | 9/2005 | Singh et al. |
| 2005/0268258 | A1 | 12/2005 | Decker |
| 2005/0268269 | A1 | 12/2005 | Coiley |
| 2005/0273732 | A1 | 12/2005 | Xu et al. |
| 2005/0278665 | A1 | 12/2005 | Gentry et al. |
| 2006/0095884 | A1 | 5/2006 | Skoll et al. |
| 2006/0095889 | A1 * | 5/2006 | Cote et al. ............... 716/21 |
| 2006/0101368 | A1 | 5/2006 | Kesarwani et al. |
| 2006/0123364 | A1 | 6/2006 | Cook et al. |
| 2007/0094622 | A1 | 4/2007 | Lee et al. |
| 2007/0106969 | A1 | 5/2007 | Birch et al. |
| 2007/0118827 | A1 | 5/2007 | Rahman |
| 2007/0234266 | A1 | 10/2007 | Chen et al. |
| 2007/0245274 | A1 | 10/2007 | Kimura |
| 2007/0288881 | A1 | 12/2007 | Maheshwarla et al. |
| 2007/0299647 | A1 | 12/2007 | Bolcato et al. |
| 2008/0022251 | A1 | 1/2008 | McConaghy et al. |
| 2008/0034336 | A1 * | 2/2008 | Hirano ............ G06F 17/5036 716/112 |
| 2008/0086709 | A1 * | 4/2008 | Rittman ............... 716/11 |
| 2008/0133201 | A1 | 6/2008 | Guedon |
| 2008/0148195 | A1 | 6/2008 | Chan et al. |
| 2008/0209365 | A1 | 8/2008 | Riviere-Cazaux |
| 2008/0244497 | A1 | 10/2008 | Zhao et al. |
| 2008/0244498 | A1 | 10/2008 | Gupta et al. |
| 2009/0019411 | A1 | 1/2009 | Chandra et al. |
| 2009/0031261 | A1 | 1/2009 | Smith et al. |
| 2009/0089733 | A1 | 4/2009 | Chang et al. |
| 2009/0144042 | A1 | 6/2009 | Lorenz et al. |
| 2009/0150842 | A1 | 6/2009 | Kemerer et al. |
| 2009/0254874 | A1 | 10/2009 | Bose |
| 2009/0265672 | A1 | 10/2009 | St. John et al. |
| 2010/0083200 | A1 | 4/2010 | Song et al. |
| 2010/0217577 | A1 * | 8/2010 | Korobkov et al. ............... 703/18 |
| 2011/0107293 | A1 | 5/2011 | Ganzhorn et al. |
| 2011/0197170 | A1 | 8/2011 | Chandramohan et al. |
| 2011/0314437 | A1 | 12/2011 | Mcilrath |
| 2012/0022846 | A1 | 1/2012 | White et al. |
| 2012/0023465 | A1 | 1/2012 | Gopalakrishnan et al. |
| 2012/0023467 | A1 | 1/2012 | McSherry et al. |
| 2012/0117530 | A1 | 5/2012 | Green |

FOREIGN PATENT DOCUMENTS

| | | |
|---|---|---|
| TW | 200820613 A | 5/2008 |
| TW | 200905505 A | 2/2009 |

OTHER PUBLICATIONS

Non-Final Office Action dated Jun. 15, 2012 for U.S. Appl. No. 12/982,822.

Non-Final Office Action dated Jun. 12, 2012 for U.S. Appl. No. 12/982,628.

Non-Final Office Action dated Sep. 14, 2012 for U.S. Appl. No. 13/189,274.

Non-Final Offiec Action dated Sep. 21, 2012 for U.S. Appl. No. 12/982,721.

Non-Final Office Action dated Oct. 3, 2012 for U.S. Appl. No. 12/982,732.

Final Office Action dated Nov. 13, 2012 for U.S. Appl. No. 12/982,822.

Notice of Allowance dated Nov. 14, 2012 for U.S. Appl. No. 12/982,628.

T. Quarles, "SPICE3 Version 3f3 User's Manual", May 1993.

(56) References Cited

OTHER PUBLICATIONS

Notice of Allowance dated Jan. 7, 2013 for U.S. Appl. No. 13/189,274.
Non-Final Office Action dated Jan. 18, 2013 for U.S. Appl. No. 12/982,790.
Final Office Action dated Feb. 19, 2013 for U.S. Appl. No. 12/982,732.
Final Office Action dated Apr. 4, 2013 for U.S. Appl. No. 12/982,721.
International Search Report and Written Opinion dated Sep. 16, 2011 for PCT App. No. PCT/US11/45119.
International Search Report and Written Opinion dated Sep. 16, 2011 for PCT App. No. PCT/US11/45110.
International Search Report and Written Opinion dated Sep. 22, 2011 for PCT App. No. PCT/US11/45126.
International Search Report and Written Opinion dated Sep. 22, 2011 for PCT App. No. PCT/US11/45123.
International Search Report and Written Opinion dated Dec. 9, 2011 for PCT App. No. PCT/US11/45104.
International Search Report and Written Opinion dated Dec. 7, 2011 for PCT App. No. PCT/US11/45091.
Final Office Action dated May 2, 2013 for U.S. Appl. No. 12/982,790.
Non-Final Office Action dated Aug. 6, 2013 for U.S. Appl. No. 12/982,732.
Non-Final Office Action dated Aug. 20, 2013 for U.S. Appl. No. 13/189,274.
Notice of Allowance dated Oct. 21, 2013 for U.S. Appl. No. 12/982,822.
Notice of Allowance dated Oct. 30, 2013 for U.S. Appl. No. 12/982,721.
Notice of Allowance dated Nov. 12, 2013 for U.S. Appl. No. 12/982,790.
Notice of Allowance dated Dec. 4, 2013 for U.S. Appl. No. 13/189,274.
Notice of Allowance dated Dec. 9, 2013 for U.S. Appl. No. 12/982,732.
Notice of Allowance dated Mar. 6, 2014 for U.S. Appl. No. 12/982,822.
Non-Final Office Action dated Jan. 20, 2015 for U.S. Appl. No. 14/247,236.
Foreign Office Action dated May 14, 2015 for Taiwanese Appln. No. 100126052.
Final Office Action dated May 1, 2015 for U.S. Appl. No. 14/247,236.
Foreign Office Action for TW Patent Application No. C23227/157695 dated May 18, 2015 (8 pages).
Notice of Allowance dated Aug. 11, 2015 for U.S. Appl. No. 14/247,236.
Foreign Office Action dated Aug. 14, 2015 for Taiwanese Appln. No. 100126109.

* cited by examiner

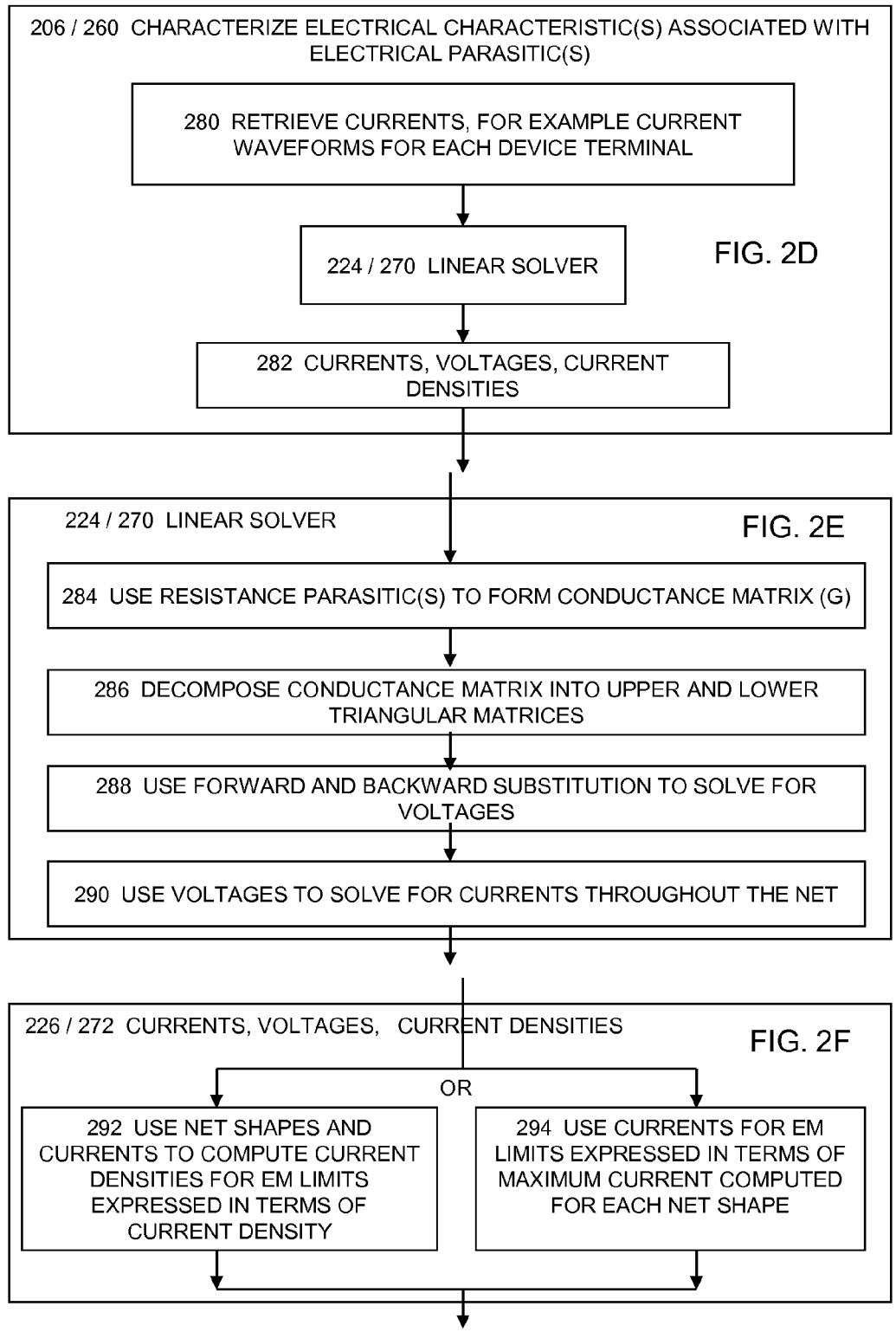

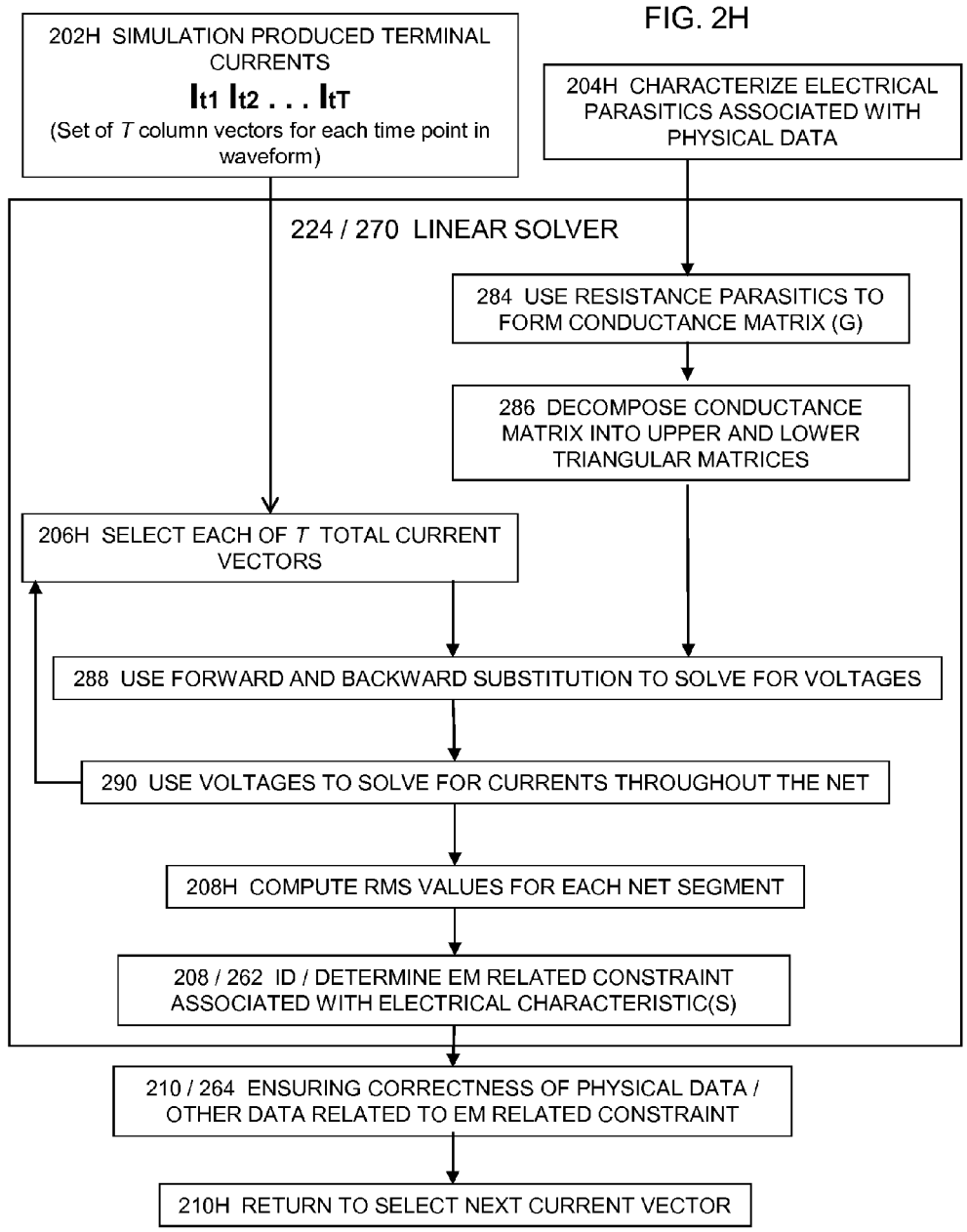

METHODS, SYSTEMS, AND ARTICLES OF MANUFACTURE FOR IMPLEMENTING ELECTRONIC CIRCUIT DESIGNS WITH ELECTRO-MIGRATION AWARENESS

CROSS-REFERENCE TO RELATED APPLICATION(S)

This application claims the benefit of U.S. Provisional App. Ser. No. 61/367,398, filed on Jul. 24, 2010 and entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS", U.S. Provisional App. Ser. No. 61/367,412, filed on Jul. 24, 2010 and entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. Provisional App. Ser. No. 61/367,404, filed on Jul. 24, 2010 and entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS", U.S. Provisional App. Ser. No. 61/367,406, filed on Jul. 24, 2010 and entitled "METHODS, SYSTEMS, AND ARTICLES OF MANUFACTURES FOR IMPLEMENTING ELECTRONIC CIRCUIT DESIGNS WITH IR-DROP AWARENESS", U.S. Provisional App. Ser. No. 61/367,407, filed on Jul. 24, 2010 and entitled "METHODS, SYSTEMS, AND ARTICLES OF MANUFACTURES FOR IMPLEMENTING ELECTRONIC CIRCUIT DESIGNS WITH SIMULATION AWARENESS", and U.S. Provisional App. Ser. No. 61/367,410, filed on Jul. 24, 2010 and entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS". The entire contents of the aforementioned applications are hereby expressly incorporated by reference in their entirety.

This application is related to U.S. patent application Ser. No. 12/982,721, entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. patent application Ser. No. 12/982,790, entitled "METHODS, SYSTEMS, AND ARTICLES OF MANUFACTURE FOR IMPLEMENTING ELECTRONIC CIRCUIT DESIGNS WITH SIMULATION AWARENESS", U.S. patent application Ser. No. 12/982,628, entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS", and U.S. patent application Ser. No. 12/982,732, entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS". The entire disclosures of the above applications are hereby expressly incorporated by reference in their entireties in the instant Application.

BACKGROUND

The recent advances in very deep sub-micron (VDSM) integrated circuits (ICs) have brought new challenges in the physical design methodology process of integrated systems. In modern electronic circuits, geometries become smaller; clock frequencies increase; and on-chip interconnections gain increased importance in the prediction of performance. Nonetheless, it has been found that from 0.13 μm and below, ICs are more susceptible to wear-out over time (electro-migration or EM) due to current densities, which requires some degree of built-in fault-tolerance and a careful design planning. Meanwhile, increased power demanded on ever shrunk chip size causes higher current densities within the power routing. Uni-directional current flow in analog designs also requires tracking of current densities in signal nets as well. Higher currents and/or higher operating temperatures induce more significant EM effects in which metal lines begin to wear out during a chip's lifetime. Such concerns have led to manufacturers creating current density limits for ICs and requiring designers to adhere to predefined current density limits.

The electro-migration problem in designing an electronic circuit is that there exist many unknowns until the very end of the design cycle in a conventional approach. Nevertheless, decisions about the structure, size and layout of many circuit component, e.g., the power grid, have to be made at very early stages when a large part of the chip design has not even begun. In addition, as VLSI technology scales, interconnects are becoming the dominant factor determining system performance and power dissipation. Interconnect reliability due to electro-migration is fast becoming a serious design issue particularly for long signal lines. In fact, it has been recently shown that interconnect Joule heating in advanced technology nodes can strongly impact the magnitude of the maximum temperature of the global lines despite negligible changes in chip power density which will, in turn, strongly affect the electro-migration lifetime of the interconnect. In analog designs, uni-directional current flow and smaller wire geometries create EM concerns for the signal nets as well.

Unfortunately, most conventional electronic circuit design tools focus on post-layout verification of interconnect when the entire chip design is complete and detailed information about the parasitics of the physical designs and the currents drawn by the transistors are known. Electro-migration problems revealed at this stage are usually very difficult or expensive to fix so the conventional methodologies help to design an initial electronic design and refine it iteratively at various design stages. In other words, the conventional circuit synthesis step is followed by layout synthesis and each step is carried out independent of the other. This is again followed by a physical or formal verification step to check whether the desired performance goals have been achieved after layout generation and extraction. These steps are carried out iteratively in such conventional approaches till the desired performance goals are met.

The behavior of analog circuits is even more sensitive to layout induced parasitics and thus electro-migration problems due to the unidirectional current flows in various circuit components. Parasitics not only influence the circuit performance but may often render it non-functional.

Thus, there exists a need for implementing electronic circuit designs with electro-migration awareness early in the design stage.

SUMMARY

What is needed is a method, a system, and a computer program product for implementing electronic circuit designs with electro-migration awareness. In various embodiments, the method or the system for implementing electronic circuit designs with electro-migration awareness comprises the process or module for identifying, determining, or updating physical data of a net, a device, or a component of a physical design of the electronic circuit. In some embodiments, the method or the system may also comprise the process or module for identifying, determining, or characterizing an electrical parasitic that is associated with the component in the physical design. In some embodiments, the method or the system may also comprise the process or module for identifying, determining, or characterizing a device parameter that is associated with the component in the physical design. In some embodiments, the method or the system may also comprise the process or module for identifying, determining, or characterizing an electrical parasitic or a device parameter that is associated with the component in the physical design. In these embodiments, the electrical parasitic and the device parameter are collectively referred to as "electrical parasitic" or simply "parasitic".

The method or the system may also comprise the process or module for characterizing one or more electrical characteristics that are associated with electrical parasitics and the physical data and for displaying the one or more electrical characteristics on a display apparatus.

In some embodiments, the method or the system for implementing electronic circuit designs with electro-migration awareness may optionally comprise the process or module for identifying or determining one or more electro-migration related constraints that are associated with one or more parameters, e.g., electrical parameters, etc. The method or the system may also optionally comprise the process or module for ensuring correctness of the physical data and/or other data that are related to the one or more electro-migration related constraints in some embodiments.

In some embodiments where at least one of the one or more electro-migration related constraints is not met, the method or the system may further optionally comprise the process or module for determining adjustments for the physical data, the net(s), and/or the device(s) and/or providing hint(s) to correct the physical data. Some embodiments may further comprise the process or module for checking to ensuring that the adjustments for the physical data do not violate or cause conflict with other design rules, constraints, or other issues, etc. Some embodiments may further comprise automatic or assisted application of the adjustments to fix or repair the physical data. More description of the aforementioned processes or modules will be further described in greater details in the subsequent paragraphs with reference to various figures.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAIL DESCRIPTION

Various embodiments of the invention are directed to a methods, systems, and articles of manufacture for implementing electronic circuit designs with electro-migration awareness in a single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments of the present invention encompasses present and future known equivalents to the components referred to herein by way of illustration.

Figure 1A:
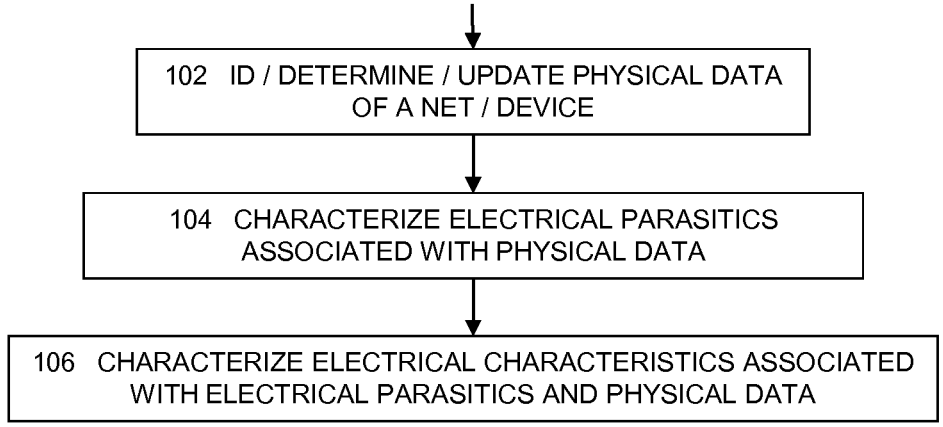
FIGS. 1A-B illustrate top level block diagrams for implementing various embodiments of the methods or systems for implementing electronic circuit design with electro-migration awareness.

Referring to FIG. 1A which illustrates a top level diagram for implementing various embodiments of the methods or systems for implementing electronic circuit design with electro-migration awareness, the method or system for implementing electronic circuit designs with electro-migration awareness comprises the process or module for identifying, determining, or updating physical data of a net, a device, or a component (hereinafter "a component" collectively) of an electronic circuit physical design (102) in various embodiments.

In one or more embodiments, the method or system for implementing electronic circuit designs with electro-migration awareness may further comprise the process or hardware module for characterizing one or more electrical parasitics that are associated with physical data at 104. In one or more embodiments, the method or system for implementing electronic circuit designs with electro-migration awareness may comprise the process or hardware module for characterizing the electrical characteristics that are associated with the one or more electrical parasitics and the physical data at 106. In some embodiments, a user may invoke or utilize the methods or the systems described herein via a terminal or a user interface 110.

In these embodiments, the method or the system needs only a partial layout that comprises merely one component, such as an interconnect wire segment, a via, or a via cluster, to perform its intended functions of implementing electronic circuit design with electro-migration awareness. In other words, some embodiments as described herein do not require a complete physical layout that have gone through the complete placement, global routing, and detail routing stages. That is, the method and system provide the designers with the ability to implement the electronic circuit design with electro-migration awareness from the first component, the first device, or the first net in the physical design without going through costly iterations between the physical design and the post-layout verification design flows.

For example, even if a physical design contains only one segment of an interconnect, and the remainder of the physical design has not been completed yet, the method or the system may still determine whether this particular interconnect segment meets one or more EM related constraints and whether and what kind of adjustments need to be made to the design to ensure the compliance of the one or more EM related constraints.

In some embodiments, the action of determining whether the segment meets the EM related constraints and subsequent adjustment(s) occurs before one or more subsequent physical design objects are created. In some embodiments, the act of determining is done before the created or modified physical design object is stored in a database. In some embodiments, an adjustment comprises creation of a new route or a segment thereof or modification of an existing route or a segment thereof. In some embodiments, an adjustment comprises placement of a component in a physical design of an electronic circuit design.

In some embodiments, the characterization of electrical parasitics associated with physical data may be done with a two stage approach. This process begins with the selection a particular net or partial net. In the first stage, the process identifies where along that net that a geometric description should be created. The geometric descriptions may include wire widths and spacings, conductor and ILD (inter layer dielectrics) thicknesses, or thickness of barrier materials. A common description may be created and provided via an API (application programming interface.)

The second stage may include one or more components that may translate, transform, convert, or map (hereinafter "map") the geometric description to an equivalent parasitic value such as a resistance, capacitance or inductance. This translation, transformation, conversion, or mapping (hereinafter "mapping") may be done with mathematical algorithms or models that are often referred to as parasitic extraction. The models may be created through the use of semi-empirical methods that combine models or knowledge of the underlying physics with data provided by various solver(s), simulator(s), or a combination thereof. In some cases, the mapping for capacitance may also be done with a solver.

In some embodiments, the second stage may use parasitic extraction for some nets and a field solver for other nets. In some embodiments, the second stage may use a combination of parasitic extraction for, for example, resistance(s) and a field solver for, for example, capacitance(s) on the same net. In some embodiments, the characterization of electrical parasitics may be performed with extraction tools that map geometric dimensions and patterns to corresponding parasitics such as R, L, and C. In some embodiments, the characterization of electrical parasitics includes the use of field solvers (such as but not limited to one or more EM field solvers) that map geometric dimensions and patterns to capacitance(s).

Figure 1B:
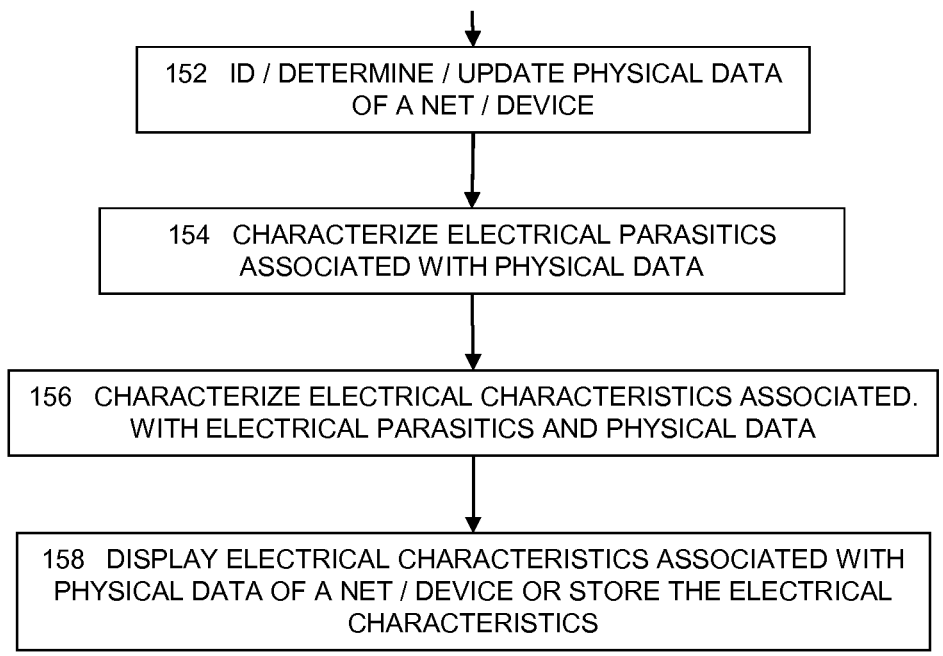

Referring to FIG. 1B which illustrates a top level diagram for implementing various embodiments of the methods or systems for implementing electronic circuit design with electro-migration awareness, the method or system for implementing electronic circuit designs with electro-migration awareness comprises the process or module for identifying, determining, or updating physical data of a component of an electronic circuit physical design at 152 in one or more embodiments. In some embodiments, the method or the system may further comprise the process or hardware module for characterizing one or more electrical parasitics that are associated with the physical data of the component at 154.

In addition, the method or the system may further comprise the process or hardware module for characterizing the electrical characteristics that are associated with the one or more electrical parasitics and the physical data of the component at 156. Moreover, the method or the system may further optionally comprise the process or hardware module for displaying the electrical characteristics on a display apparatus or storing, either persistently or temporarily, the electrical characteristics in a non-transitory computer accessible storage medium at 158. In some embodiments, a user may invoke or utilize the methods or the systems described herein via a terminal or a user interface 160.

In some embodiments, the physical data may be identified, determined, or updated by performing an electrically aware design extraction (EAD extraction). More details about the EAD extraction are described in the U.S. application Ser. No. 12/982,732, which is entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS", the contents of which are hereby incorporated by reference in their entirety.

In some embodiments, the physical data may be related to a net, which comprises one or more wires or interconnects connecting various other components together in an electronic circuit design. In some embodiment, the physical data may be related to a single component in the physical design (e.g., a layout) of the electronic circuit. For example, the method or the system may be applied to determine whether an interconnect segment complies with one or more electro-migration related constraints. In this example, the physical data may comprise, for example, the width, the length, the cross-sectional area along the segment, overlap of a metal object and via object etc. In some embodiments, the physical data may be related to a device, which comprises a component that comprises a source and a drain. A device may comprise, for example, a field-effect transistor. In this example, the physical data may comprise the description of physical device layers and geometric descriptions that define the gate, source and drain regions. In various embodiments, the physical data may further comprise the material and its associated physical (e.g., physical or electrical) attributes. In various embodiments, the method or system may characterize shapes associated with a net and need to determine connectivity to identify one net from another.

In various embodiments, the characterization of parasitics such as R, L, or C for shapes that constitute a net and the subsequent characterization of the electrical behavior or characteristics such as currents, voltages, or current densities occur as a net (or shape that is part of a net) is created or modified. This characterization may occur incrementally as each net is created or modified and may occur while there is only a partial layout. The simulation produced terminal currents may be used as one or more nets that connect to those terminals are created or modified.

For example, the physical data for a wire segment may comprise the material (e.g., Copper, Aluminum, or Tungsten), one or more physical attributes, such as the thermal conductivity, surface boundary activation energy, etc. and/or one or more electrical attributes, such as the electrical conductance, Blech distance, or electrical resistivity.

In some embodiments, the process for identifying, determining, or updating physical data of a net, a device, or a component of an electronic circuit physical design may be invoked from within a physical design tool or flow, such as a layout editor, while the designer is implementing or modifying the physical design of the electronic circuit rather than from a post-layout verification tool or flow. In some embodiments, device recognition and connectivity tasks are performed to able to map electrical characteristics such as current at a given terminal with the proper net(s) attached to that terminal. In some embodiments, connectivity may be directed to traverse the nets hierarchically and stop on levels determined by the user.

In some embodiments, the drawn geometries of the physical design objects may be combined with manufacturing models to estimate manufactured geometries for those objects or statistical distributions associated with the object. In this approach the as-manufactured geometries may be used with the parasitic models to provide a more accurate estimate of the electrical parasitics, R, L or C.

In a single embodiment or in some embodiments, the method or system for implementing electronic circuit designs with electro-migration awareness comprises the process or module for characterizing one or more electrical parasitics that are associated with the physical data 104. In some embodiments, the one or more electrical parasitics comprise resistance, self- or coupled-inductance, or capacitance that is associated with the physical data. In the previous example of an interconnect segment in a physical design, the method or the system may characterize the resistance of this particular interconnect segment by using the electrical resistivity, the length of the segment, and the cross-sectional area along the segment. In some embodiments the system monitors and tracks the relevant physical data associated with the creation or change to the design, for example the creation of a net or the widening of a wire segment in a net. Resistance and capacitance models may be applied automatically to compute the parasitic data. Thus, parasitics may be generated interactively as physical design objects have been or are being created or modified. The set of partial design objects, including a set of one or more objects in the electronic circuit design that is interactively analyzed may form a partial layout. The data is stored for use with subsequent electrical analysis steps and may additionally be displayed in parasitic form.

In various embodiments, the parasitic data and a linear solver may be used to solve for, for example, currents and voltages associated with the physical data. For example, the linear solver and parasitic data may be used to solve for all the currents distributed throughout one or more signal nets. In this approach, the non-linear devices that are defined as part of a schematic design are generally solved using a circuit simulator. Electrical parameters, for example currents or voltages, associated with the device terminals are stored and provided to the solver. The remaining interconnect portion of the circuit created during layout may be solved as linear system using direct methods, for example Cholesky-based, or iterative, for example Conjugate Gradient, techniques. For example, a linear system could be formed from the following equation:

$$G \cdot \vec{v} = \vec{i},$$

where G is the matrix of conductance values, v is the vector of node voltages and i is the vector of independent sources is solved using a linear solver employing direct or indirect methods. For example, Cholesky factorization may be used to separate the conductance matrix into a product of lower and upper triangular matrices and then forward and back substitution may be used to solve for the voltages throughout the network.

In the aforementioned approaches, the device related simulation may be done during the schematic creation stage prior to physical design and may simply be stored for use during physical design. For example, the interconnect routing creates a net that connects a series of device terminals through multiple segments that direct the current from one or more terminals to one or more other terminals. The terminal currents define the current coming into and out of a particular net, for example but not limited to a signal net in some embodiments. A solver may be used to estimate the currents and voltages through the physical data, e.g. wire segment(s), via(s), or via cluster(s).

The solver may be part of the physical design tool software or flow or work from the same physical design database to enable more interactive feedback as the physical design is created or modified. The currents through each section of the net may be combined with the geometry of the wire, for example width, or via to compute a current density. In some embodiments where there are 2N current vectors, the solver using the Cholesky method factors the conductance matrix once and simply does forward and backward solves on each of the 2N current vectors. For cases where multiple static simulation vectors are to be analyzed, this approach provides a faster solution because the parasitics that form the conductance matrix are constant for a given set of physical data or layout configuration.

In some embodiments, the aforementioned method of a single conductance decomposition followed by forward and backward substitution may be used to produce a vector of currents where each vector element represents a point in time, associated with each sample from the current waveform. For example, this method may be used to compute rms (root mean square) values, using the current waveforms produced by the linear solver for each part of the net. More details about the single conductance decomposition followed by forward and backward substitution in these embodiments are further provided in the description of FIG. 2H.

Some other embodiments use the electrical parasitics associated with physical design to re-simulate the design. In these embodiments, the electrical parasitics such as the resistance and capacitance may need to be mapped to the schematic representation or stitched into the schematic. The parasitics may also be reduced a form that allows for faster simulation in some embodiments and retain additional capacitance values for nets where more simulation accuracy is desired. For example, the parasitics for one set of nets may have full sets of coupling capacitance values between nodes, one set may have only net to net coupling capacitances and other sets may only have the total cap and lump all coupling caps to ground. For example, the parasitics such as resistance may be reduced when more than one resistors appear in series. The simulation parameters such as temperature are matched with that used for extraction. The simulator provides parasitic aware set of voltages and currents that are used for EM checking in subsequent processes. One embodiment is where resimulation of the layout parasitics is done in conjunction with EM checking and vice versa, so that any impact of the interconnect is addressed before the layout is completed.

In a single embodiment or in some embodiments, the method or system for implementing electronic circuit designs with electro-migration awareness may further comprise the process or module of characterizing one or more electrical characteristics associated with the one or more electrical parasitics and physical data at 106 of FIG. 1A. In some embodiments, the one or more electrical characteristics comprise voltage, currents, or current densities that are associated with the one or more electrical parasitics or the physical data.

In various embodiments, characterization of the electrical characteristics associated with the electrical parasitics may be necessary or desired in order to determine the current and voltage characteristics of the created or modified physical data, such as interconnect wires, via, or via clusters. The interconnect structures may be part of signal or power nets. This characterization is not limited to interconnect in that physical design creation and modification of devices may impact device parasitics such as gate to contact capacitance or gate related fringe capacitance. Also, one device in the schematic may be represented as multiple devices, e.g. multi-fingered devices, where a single terminal current on the schematic is actually multiple currents to each finger. In this case, the schematic and layout representations may require a mapping to use the layout based parasitic data.

As a prelude for the electro-migration analysis that will be described in further details below, the EM limits provided by foundries are often tied to particular types of current for example peak, average, DC, or RMS current densities. Some embodiments may use the solved current information for a given wire segment and use the wire width to get a density value that may be compared with the limit. Some embodiments may use the solved current information and multiply the current density limit by the wire width to produce a maximum current for a given wire width and then compare that value against the solved currents. Some embodiments as described herein may evaluate one or more of these currents correctly by matching the set of currents with the correct limits. For EM limits such as the peak current, the simulation produced current waveforms may need to be post-processed to determine the peak values for each device terminal in some embodiments. There may be different ways to do this. In one embodiment, the process flow invokes a method to store the maximum current at each terminal into a single vector of maximum currents. Because the peak currents at each terminal do not likely occur at the same time, a single vector of peak currents may be pessimistic in some embodiments.

In another embodiment, the method or system invokes a second method that may identify the maximum current at each device terminal and save the full set of terminal currents at that particular time. If there exist N device terminals, there will be N vectors of currents that represent the set of peak current values. This embodiment may be extended to determine the maximum and minimum currents at each device terminal which produces 2N current vectors for solving. This embodiment may use the method of single decomposition of the conductance matrix followed by forward and backward substitution to get the voltages and currents for each of the 2N vectors. This embodiment may also store at least one reference voltage as well. The current or voltage data may be stored on disk or memory and if useful, could be compressed in that it often represents a large volume of data. More information about the process or module of characterizing one or more electrical characteristics associated with one or more electrical parasitics or physical data will be described in greater details in subsequent paragraphs with reference to various figures.

In some embodiments, the method or the system may also store the one or more electrical characteristics associated with the physical data of a net, device, or component in a non-transitory computer readable storage medium or display the one or more electrical characteristics in a user interface 110 such as a graphical user interface. More details about displaying the one or more electrical characteristics in a user interface will be provided in U.S. application Ser. No. 12/982,628, which is entitled "METHODS, SYSTEMS, AND ARTICLES OF MANUFACTURE FOR PROVIDING IN SITU, CUSTOMIZABLE INFORMATION FOR IMPLEMENTING ELECTRONIC CIRCUIT DESIGNS WITH ELECTRICAL AWARENESS", the contents of which are hereby expressly incorporated by reference in their entirety.

Figure 2A:
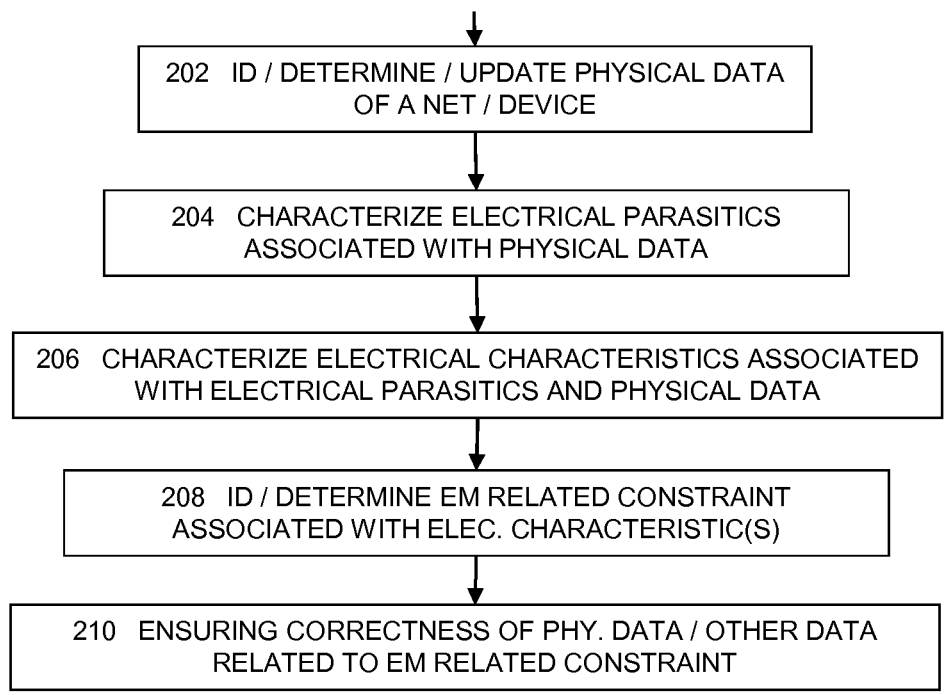
FIGS. 2A-H and J illustrate more detailed block diagrams for the method or system for implementing electronic circuit design with electro-migration awareness and some detailed information about the process or module for characterizing one or more electrical characteristics that are associated with electrical parasitics in some embodiments.
Figure 2A:
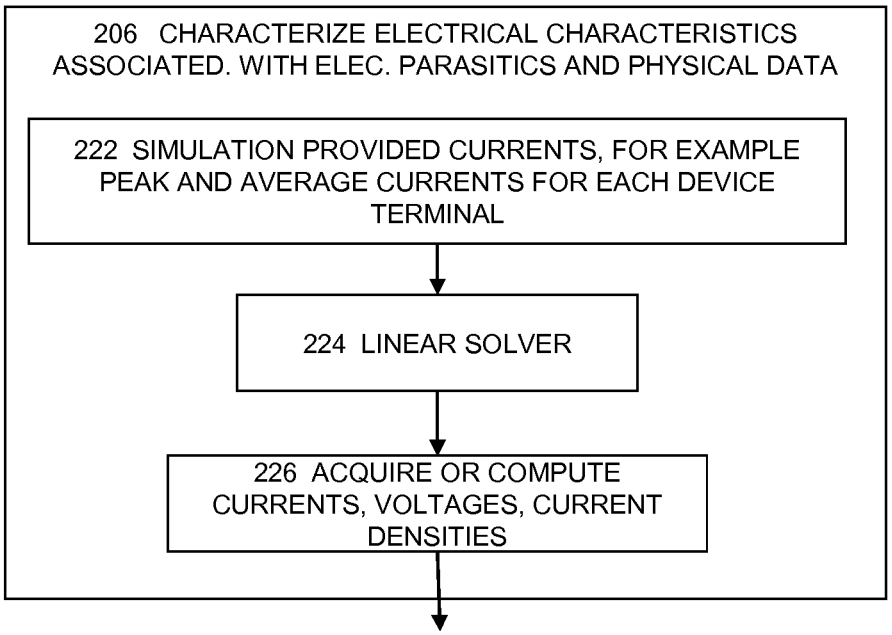

Referring to FIG. 2A which illustrates a more detailed diagram for the method or system for implementing electronic circuit design with electro-migration awareness and some detailed information about the process or module for characterizing one or more electrical characteristics that are associated with electrical parasitics in some embodiments, the method or the system may further comprise the process or a hardware module for identifying, determining, or updating physical data of a net, a device, or a component of an electronic circuit physical design (202) in various embodiments.

In a single embodiment or in some embodiments, the method or system for implementing electronic circuit designs with electro-migration awareness comprises the process or module for characterizing one or more electrical parasitics that are associated with the physical data 204 and the process or module of characterizing one or more electrical characteristics associated with the one or more electrical parasitics and physical data at 206.

In some embodiments, the method or the system for implementing electronic circuit designs with electro-migration awareness may further comprise the process or module of identifying or determining one or more EM related constraints that are associated with the one or more characterized electrical characteristics at 208. In some embodiments, the one or more EM related constraints comprise one or more limits on current densities for one or more nets, devices, or components. In some embodiments, the one or more EM related constraints may comprise one or more functions of the physical data, the electrical parasitics, or the combination thereof.

For example, an EM related constraint may be provided as a function of the geometric dimension, such as length or width, of an interconnect or via. For example, an EM related constraint may be provided as a function of via groups or arrays. For example, an EM related constraint may be provided as a function of the net attribute such as signal, power/ground. For example, an EM related constraint may be provided as a function of the duty or pulse characteristics of a particular signal. In some embodiments, the other data related to the one or more EM related constraints comprise, for example but not limited to reliability of the component related to the physical data or of the electronic circuit, power supply integrity, etc.

In these embodiments where one or more EM related constraints are identified or determined, the method or the system for implementing electronic circuit designs with electro-migration awareness may further comprise the process or module of ensuring correctness of the physical data or other data related to the one or more EM related constraints at 210. More information about the processes and modules involving the identification or determination of one or more EM related constraints and ensuring the correctness of the physical data or other data related to the one or more EM related constraints will be described in further details in subsequent paragraphs with reference to various figures.

FIG. 2A further provides more details about the process or module of characterizing one or more electrical characteristics associated with one or more electrical parasitics in some embodiments. The process or module may comprise identifying or determining current such as the peak current, the maximum sustained current, the average current, or the RMS current by performing simulation(s) for each terminal of a component, device, or net at 222. In addition or in the alternative, the current waveforms, duty cycle(s), or frequency (frequencies) may also be considered in some embodiments. In some embodiments, the RMS currents may be used with analog designs or reliability critical applications where self-healing effect need not be considered. In some embodiments, the average currents may be used in, for example, some digital signal nets where self-healing effects need to be considered. The process or module 206 may further comprise using a linear solver 224 for voltages or currents of a net, device, or component in some embodiments. The process or module 206 may further comprise the use of the solved voltages and subsequent algebraic calculations using Ohm's law to determine the current(s) in each wire segment as well as the geometry of the wire segment to acquire or compute current(s) or voltage(s), or with additional computation, current density (or densities) (226) of a net, device, or component in some embodiments.

For example, the process or module 206 may identify the current(s) from the schematic enabled simulation(s) at 222 and then invoke a linear matrix solver to solve for the current flows through the net in the physical design by using the conductance at 224. It shall be noted that the method or the system may invoke one or more different solvers, such as a non-linear solver, a commercial circuit simulation tool, or a combination thereof (hereinafter solver), etc. at 224 to achieve the same purpose. More information about the processes and modules of characterizing one or more electrical characteristics will be described in further details in subsequent paragraphs with reference to various figures.

Figure 2B:
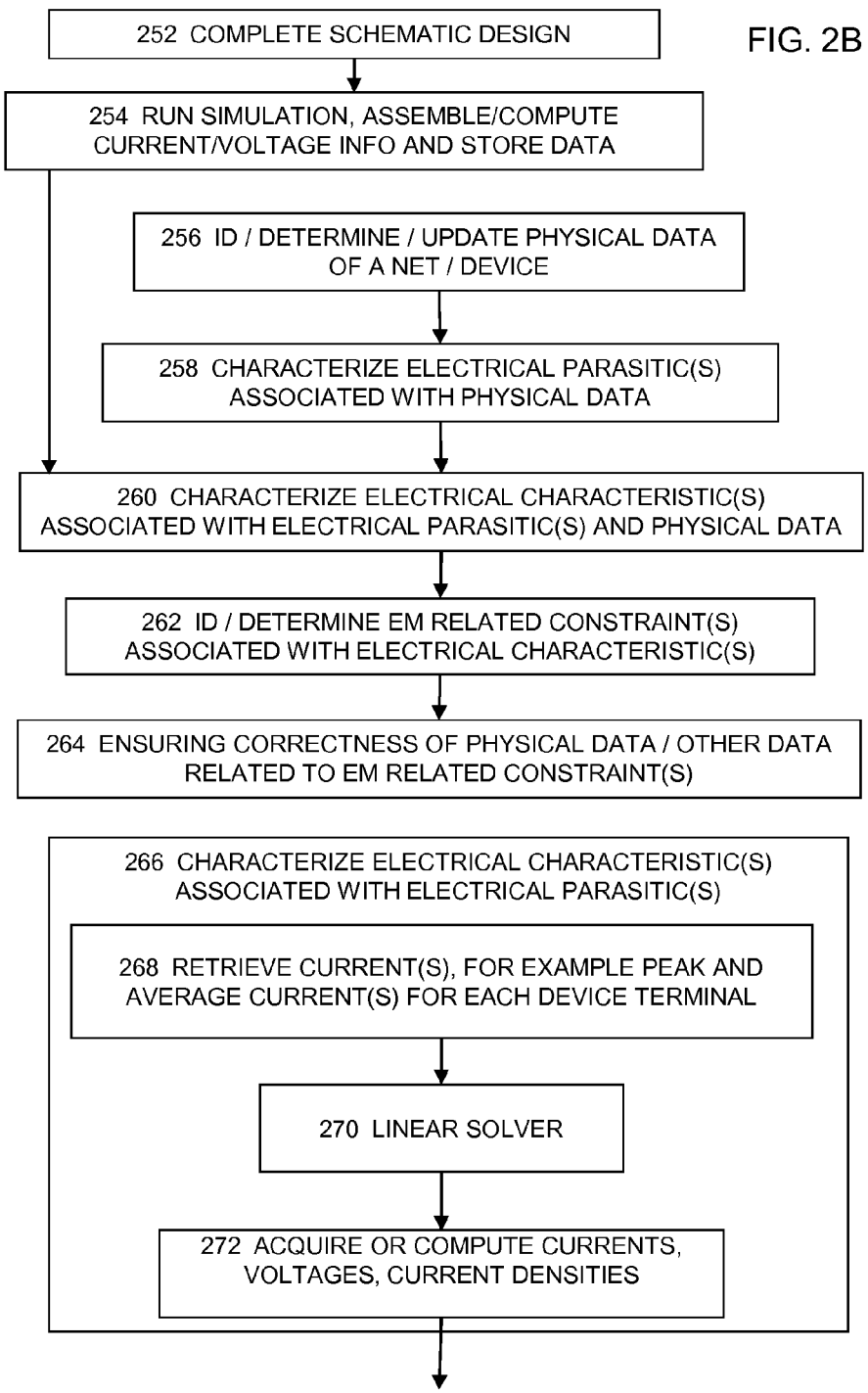

Referring to FIG. 2B which illustrates a more detailed diagram for the method or system for implementing electronic circuit design with electro-migration awareness and some detailed information about the process or module for characterizing one or more electrical characteristics that are associated with electrical parasitics, both of which are similar to the method, system, process, and module as illustrated in FIG. 2A and described in some of the preceding paragraphs. FIG. 2B is provided to point out that the device related simulation from the schematic may often be done before any physical data is created. In this case, the simulation data is assembled, may be post-processed to compute peak, RMS or average values from the waveforms and may be stored for use during physical design. One requirement for the linear solver based flow is that the terminal currents be available for retrieval and use prior to invoking the linear solver to generate the currents and voltages in the interconnect. This figure is provided to illustrate that alternative flows may be used to bring simulation data into solver based flow.

In one or more embodiments, the method or system for implementing electronic circuit designs with electro-migration awareness comprises the process or module for completing the schematic design of an electronic circuit design at 252. The method or system for implementing electronic circuit designs with electro-migration awareness comprises the process or module for running simulation(s), assembling or computing electrical data such as current data or voltage data, and storing the computed electrical data at 254 in some embodiments. The method or system for implementing electronic circuit designs with electro-migration awareness may proceed from 254 to 260 to invoke the process or the hardware module for characterizing one or more electrical characteristics that are associated with one or more electrical parasitics and the physical data of a component in the electronic circuit design in one or more embodiments.

In addition or in the alternative, the method or system for implementing electronic circuit designs with electro-migration awareness comprises the process or module for identifying, determining, or updating the physical data of a component in the electronic circuit design at 256 in one or more embodiments. In these embodiments, the method or system may further comprise the process or hardware module for characterizing one or more electrical parasitics that are associated with the physical data of the component of the electronic circuit design at 258. In one or more embodiments where the method or the system invokes the process or the hardware module at 260, the method or system for implementing electronic circuit designs with electro-migration awareness may proceed to 262 to invoke another process or hardware module for identifying or determining one or more electro-migration related constraints that are associated with the one or more electrical characteristics.

In one or more embodiments, the method or system for implementing electronic circuit designs with electro-migration awareness may further optionally comprise the process or module for ensuring correctness of the physical data or other data that are related to the one or more electro-migration related constraints at 264. In one or more embodiments, the method or system for implementing electronic circuit designs with electro-migration awareness comprises the process or module for characterizing one or more electrical characteristics that are associated with the one or more electrical parasitics at 266.

In these embodiments, the process or hardware module for characterizing the one or more electrical characteristics may comprise the corresponding process or hardware module for retrieving electrical data for one or more components at 268. In some embodiments, the electrical data comprise electrical current(s) such as peak current(s) or average current(s) for one or more terminals. In some embodiments, the process or hardware module for characterizing the one or more electrical characteristics may further comprise the corresponding process or hardware module for invoking or utilizing a solver, such as a linear matrix solver or a non-linear solver, at 270 to solve for or acquire one or more electrical data such as various current(s), voltage(s), or with additional computation, current density (or densities), at one or more components at 272.

Figure 2C:
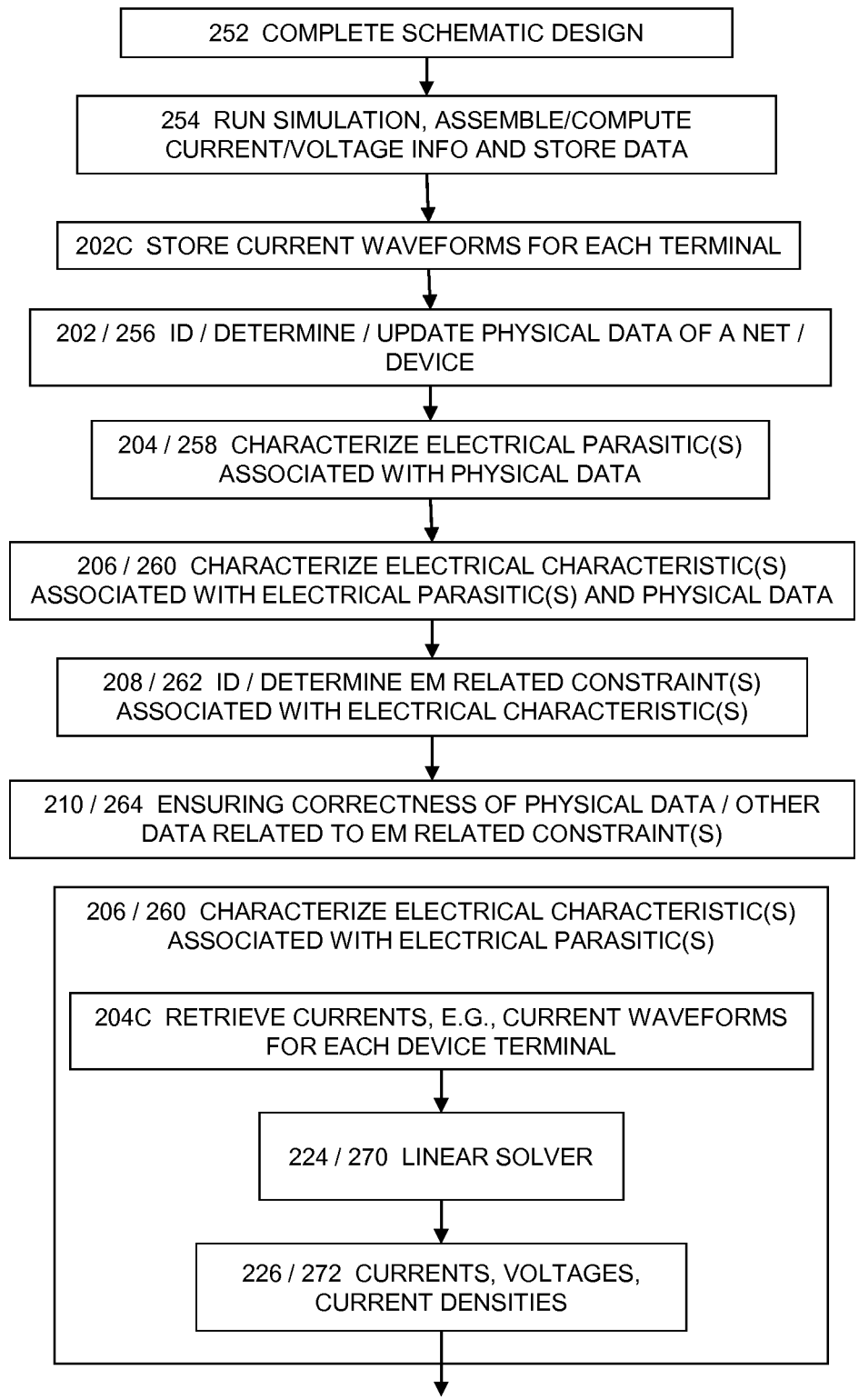

FIG. 2C illustrates more detailed block diagrams for the method or system for implementing electronic circuit design with electro-migration awareness and some detailed information about the process or module for characterizing one or more electrical characteristics that are associated with electrical parasitics in some embodiments for characterizing the RMS currents flowing through, for example, a net to determine whether certain EM related constraints are satisfied.

In one or more embodiments, the aforementioned approach comprises the processes or modules of identifying a complete schematic design of an electronic circuit at 252 and simulating, assembling or computing, and storing the information or data of various current(s) or voltage(s) in a computer readable storage medium. In some embodiments, the information or data of various current(s) or voltage(s) may be stored in a volatile memory, such as some random access memory, for a substantially real-time determination and characterization of whether at least a part of the electronic circuit complies with certain EM related constraints. In some embodiments, the information or data of various current(s) or voltage(s) may be stored in a non-volatile memory, such as a computer hard drive.

In some embodiments, the method or the system as illustrated in FIG. 2C comprises the process or hardware module of storing one or more current waveforms for each of a plurality of terminals of at least a part of the electronic circuit design at 202C. These one or more waveforms describe the current data at, for example, a terminal at certain points in time. More details about the process or module of storing one or more current waveforms will be described in subsequent paragraphs with reference to one or more figures. In these embodiments, the method or the system may further comprise the process or hardware module, which is substantially similar to the process or module 202 or 256 as described in some preceding paragraphs with reference to FIGS. 2A-B, for identifying, determining, or updating the physical data of the component. Moreover, the method or system may also comprise the process or module, which is substantially similar to the process or module 204 or 258 as described in some preceding paragraphs with reference to FIGS. 2A-B, for characterizing one or more electrical parasitic(s) that are associated with the physical data of the component.

In some embodiments, the method or the system may comprise the process or module, which are substantially similar to the process or module 206 or 260 as described in some preceding paragraphs with reference to FIGS. 2A-B, for characterizing one or more electrical characteristic(s) that are associated with the one or more electrical parasitics and the physical data of the component. The method or the system may also comprise the process or module, which are substantially similar to the process or module 208 or 262 as described in some preceding paragraphs with reference to FIGS. 2A-B, for identifying or determining one or more EM related constraints that are associated with the one or more electrical characteristics in some embodiments. The method or the system may further comprise the process or module, which are substantially similar to the process or module 210 or 264 as described in some preceding paragraphs with reference to FIGS. 2A-B, for ensuring the correctness of the physical data or other data that are related to the one or more EM related constraints in these embodiments.

FIG. 2C further illustrates more details about the process or module 206 or 260 for characterizing one or more electrical characteristics that are associated with the one or more electrical characteristics in some embodiments for characterizing the RMS currents flowing through, for example, a net to determine whether certain EM related constraints are satisfied. The method or the system may comprise the process or module for retrieving or identifying information or data of current(s) for, for example but not limited to, one or more current waveforms for each of the plurality of device terminals at 204C in some embodiments. The method or the system may then proceed to invoke the process or the module, which are substantially similar to the process or module 210 or 264 as described in some preceding paragraphs with reference to FIGS. 2A-B, of a solver, such as a linear matrix solver or a non-linear solver to solve for various current(s), voltage(s), current density (or densities), or other electrical behavior or characteristics as previously described for the process or module 226 or 272 in some embodiments.

FIG. 2D illustrates a flow diagram for more details about the process or module 206 or 260 for characterizing one or more electrical characteristics that are associated with the one or more electrical parasitics in some embodiments. The process or module for characterizing one or more electrical characteristics may comprise the process or module 280 for retrieving or identifying information or data of various current(s) in at least a portion of the layout in one or more embodiments. In some embodiments, the layout constitutes a partial or incomplete (hereinafter partial) layout that does not and will not pass a Layout Versus Schematic (LVS) check or verification due to the lack of physical design for one or more components in the layout of the electronic circuit design. In some embodiments where one device in the schematic maps to multiple devices when implemented in layout, the single terminal current may be distributed across multiple terminals as part of the synchronization that occurs between the layout and the schematic used as part of the simulation.

The process or module may further comprise the process or module, which are substantially similar to the process or module 224 or 270 as described in some preceding paragraphs with reference to FIGS. 2A-B, to invoke a solver, such as a linear matrix solver or a non-linear solver, to solve for one or more electrical characteristics of the at least a portion of the layout (282) in some embodiments. In some embodiments, the one or more electrical characteristics comprise some current(s), voltage(s), or current density (or densities) at, for example, a terminal of a component, or through a segment of an interconnect.

FIG. 2E illustrates a flow diagram for more details about the solver (224 or 270) in some embodiments. At 284, the process or module comprises using a plurality of resistance parasitics to construct an electrical conductance matrix (G) in some embodiments. The electrical conductance matrix comprises elements each of which constitutes the reciprocal of a resistance of, for example, a segment of an interconnect. The electrical conductance matrix (G) may be arranged in any manner that is suitable for solving for the electrical behavior or various electrical characteristics for the portion of an electronic circuit design of interest. For example, the electrical conductance matrix (G) may be arranged in a manner such that the portion of the electronic circuit may be solved under the Kirchhoff's junction rule (or the Kirchhoff's current law or KCL).

At 286, the process or module comprises decomposing the electrical conductance matrix into an upper triangular matrix and a lower triangular matrix in some embodiments. In some embodiments where the electrical conductance matrix constitutes a positive definite and symmetric matrix, the process or module may invoke, for example, some direct methods such as the Cholesky-based techniques or the LU decomposition techniques to decompose the electrical conductance matrix into the lower triangular matrix and the upper triangular matrix. In some other embodiments, the process or the module may invoke other numerical techniques such as the conjugate gradient method or the biconjugate gradient method to achieve substantially the same purpose.

At 288, the process or module may comprise using forward and backward substitution to solve for one or more electrical characteristics in some embodiments. In one embodiment, the one or more electrical characteristics comprise various voltages at various nodes in the at least a portion of the electronic circuit design. In these embodiments where the one or more electrical characteristics comprise various voltages, the process or module may further comprise using the various voltages to solve for various currents flowing through the component. In some cases, the determination of various currents may be sufficient to determine whether or not the portion of the electronic circuit design satisfies certain design rules.

FIG. 2F illustrates more details for the process or module for solving for currents, voltages, or current densities at 226 or 272. In one or more embodiments, the process or module for solving for various currents, voltages, or current densities at 226 or 272 may comprise using net shapes and currents determined at 290 to determine current densities for one or more EM related limits or constraints that are expressed in terms of current densities at 292.

For example, in some embodiments where various processes or modules as described herein are integrated with or integrally linked to a physical design implementation platform, such as a layout tool or editor, the physical shapes and thus the geometric information or data of the physical shapes of the at least a portion of an electronic circuit design are readily available. In these embodiments, the process or module may further determine, for example, current densities by performing further computation using the determined currents and the geometric information of various physical shapes. In the example of the foundry-imposed limits on current densities, the method or the system may determine the current densities through various parts of the portion of electronic circuit design and then determines whether the portion of the electronic circuit design satisfies the limits on current densities by comparing the determined current densities with the limits on current densities imposed by the design rules.

In some embodiments, the process or module for solving for various currents, voltages, or current densities at 226 or 272 may comprise using currents for EM limits expressed in terms of maximum current that is computed for each net shape at 294. For example, certain foundries impose EM related constraints by imposing limits on current densities through various parts of the portion of the electronic circuit design. In some embodiments where various processes or modules are integrated with or integrally linked to some physical design implementation platform, such as a layout tool or editor, the physical shapes and thus the geometric information of these physical shapes in the portion of the electronic circuit design become available. In these embodiments, the method or the system may determine whether the portion of the electronic circuit design satisfies the limitations on current densities by translating the current density limits into limits on currents based on the geometric information and further by comparing such limits on currents with the currents determined at 290.

Figure 2G:
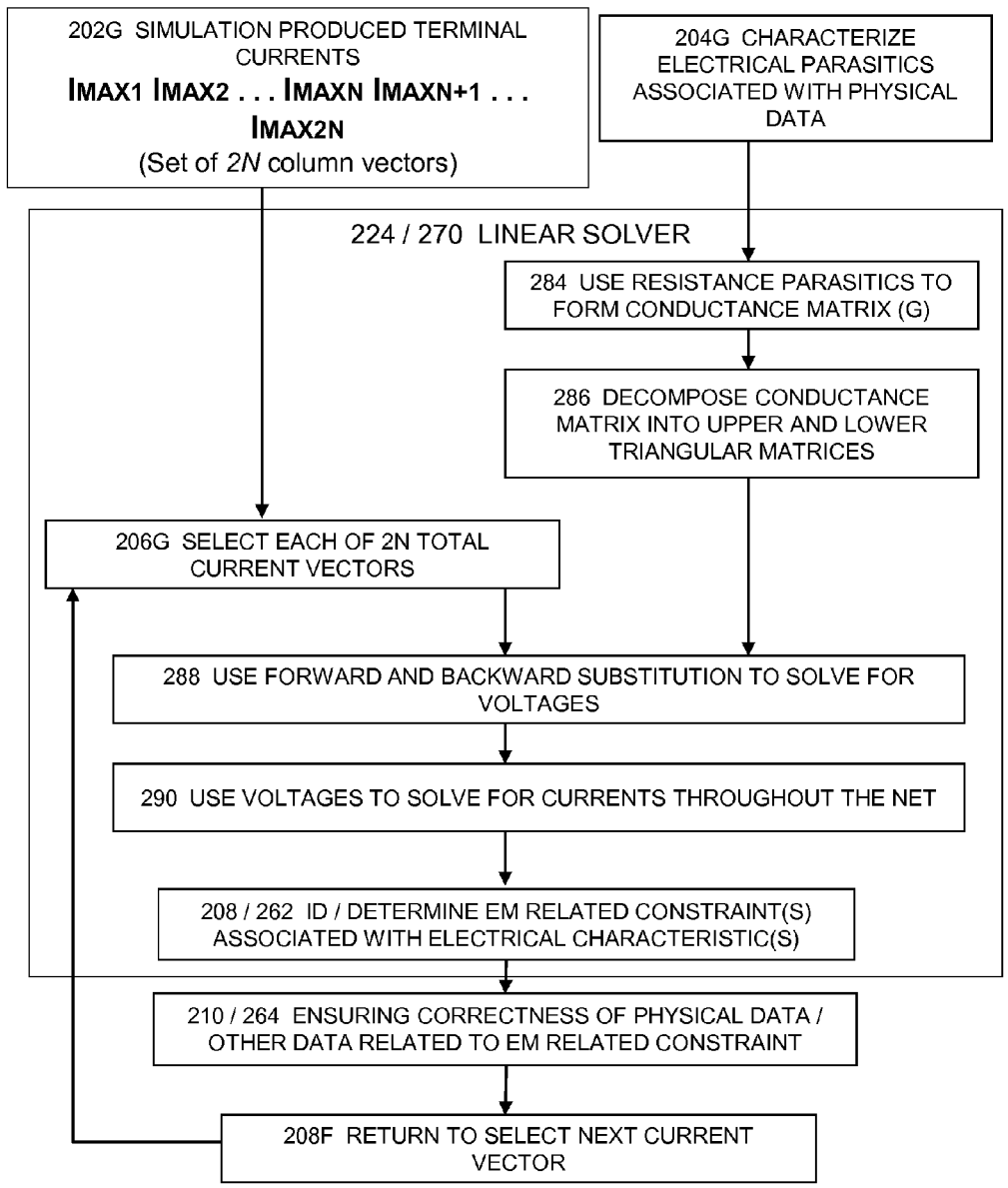

FIG. 2G illustrates a flow diagram for more detailed process or module for implementing electronic circuit design with electro-migration awareness in some embodiments. More specifically, FIG. 2G shows the example where peak currents constitute the electrical characteristics of interest for electro-migration aware electronic circuit design implementation and illustrates the process or module that constructs an electrical conductance matrix (G), decomposes the electrical conductance matrix once for electrical parasitics, and then uses the same decomposition for each of a plurality of current vectors (2N current vectors that represent the maximum current and the minimum current for each of N device terminals in the example illustrated in FIG. 2G). In the example in FIG. 2G, the term max refers to the maximum positive and maximum negative current values at each of N terminals, thus producing 2N current vectors.

The process or module may comprise identifying a set of 2N current vectors ($I_{MAX1}, I_{MAXN2}, \ldots, I_{MAXN}, I_{MAXN+1} \ldots I_{MAX2N}$) for a total of N or 2N terminals from one or more simulations at 202G in some embodiments. In some embodiments where the currents are bi-directional, both the positive maximum current and the maximum negative current are examined for each of the N terminals, and thus there are 2N column vectors for the 2N currents at these N terminals. In some embodiments where the electrical currents are uni-directional such as in the cases where one or more signal nets are identified as the components for EM analysis, the process or module examines the maximum current at each terminal, and thus there are 2N column current vectors for 2N terminals in these embodiments. At 206G, the process or module further comprises selecting one of these 2N current vectors that are identified at 202G in some embodiments.

In one or more embodiments, the process or module may further comprise characterizing one or more electrical parasitics that are associated with the physical data of the component of a portion of an electronic circuit design at 204G. In these embodiments, the process or module may further comprise using the one or more electrical parasitics, such as the resistance parasitics, to construct an electrical conductance matrix (G) in a manner that is substantially similar to that of 284 as described in some of the preceding paragraphs. The process or module may then comprise decomposing the electrical conductance matrix (G) into an upper triangular matrix and a lower triangular matrix in a manner that is substantially similar to that of 286 as described in some of the preceding paragraphs in these embodiments.

Upon the selection of one of the 2N current column vectors at 206G and the decomposition of the electrical conductance matrix (G) at 286, the process or module may then uses, for example, forward substitution and backward substitution to solve for voltages for the portion of the electronic circuit design in a manner that is substantially similar to that of 288 as described in some of the preceding paragraphs in some embodiments. The process or module may then use the voltages to solve for currents that flow through the component for the current vector that is selected or identified at 206G in some embodiments. In one or more embodiments, the process or module may comprise identifying or determining one or more proper EM related constraints that are associated with the electrical characteristics in a manner that is substantially similar to that of 208 or 262 as described in some of the preceding paragraphs.

The process or module may further comprise ensuring the correctness of the physical data or other data related to the one or more EM related constraints in a manner that is substantially similar to that of 210 or 264 as described in some of the preceding paragraphs in some embodiments. At 208F, the process or module may then loop back to 206G to select the next current vector of the 2N vectors and repeats the above steps. In this example, the current vector for each terminal is examined to determine whether the corresponding EM related constraint(s) is satisfied.

FIG. 2H illustrates a flow diagram for more detailed process or module for implementing electronic circuit design with electro-migration awareness in some embodiments. More specifically, FIG. 2H shows the example where the RMS currents constitute the electrical characteristics of interest for electro-migration aware electronic circuit design implementation. In the cases where the RMS currents are of interest, the time trajectory of the current waveform or at least an approximate form of the time trajectory needs to be analyzed to determine whether certain EM related constraints are satisfied. In some embodiments where the process or modules as illustrated in FIG. 2H applies, the method or system comprises identifying or determining a set of T column vectors $(I_{t1}, I_{t2} \ldots I_{tT})$ at each of a set of time points in a waveform at 202H. The method or the system may then proceed to invoke the solver 224 or 270 to identify or select one of the T column current vectors at 206H in some embodiments.

The method or system may further comprise characterizing one or more electrical characteristics that are associated with the physical data of a component of a portion of an electronic circuit design at 204H and proceeds to 284 to use the one or more electrical parasitics, such as resistance parasitics, to construct an electrical conductance matrix (G) in a manner that is substantially similar to that of 284 as described in some of the preceding paragraphs. In these embodiments, the method or system may further comprise decomposing the electrical conductance matrix (G) into an upper triangular matrix and a lower triangular matrix in a manner that is substantially similar to that of 286 as described in some of the preceding paragraphs.

After the identification of one of the T column current vectors at 206H and the decomposition of the electrical conductance matrix (G), the method or the system may then comprise using forward and backward substitution to solve for various voltages and solving for currents through the component by using at least the voltages at 290 in a manner that is substantially similar to that of 288 and 290 as described in some of the preceding paragraphs. The method or system may then loop back to 206H to identify or select another current vector of the T column current vectors. Once all of the T column current vectors have been processed by using the processes or modules 206H, 288, and 290, the method or system may then proceed to 208H to compute the RMS values for, e.g., each net segment in some embodiments where a net has been identified as the component of interest.

In one or more embodiments, the process or module may comprise identifying or determining one or more proper EM related constraints that are associated with the electrical characteristics in a manner that is substantially similar to that of 208 or 262 as described in some of the preceding paragraphs. The process or module may further comprise ensuring the correctness of the physical data or other data related to the one or more EM related constraints in a manner that is substantially similar to that of 210 or 264 as described in some of the preceding paragraphs. At 210H, the method or system may loop back to 202H to further identify or select the next set of current vectors in some embodiments.

In some embodiments, the average values may be computed as part of the RMS computation from the current waveforms. In these embodiments, the two methods are similar in terms of decomposition of the conductance matrix and the solving for voltages and currents through each resistance element. As the RMS values are computed for each waveform, the average currents are computed as well. The RMS values are checked against RMS limits, and the average values checked against the average limits.

Figure 2J:
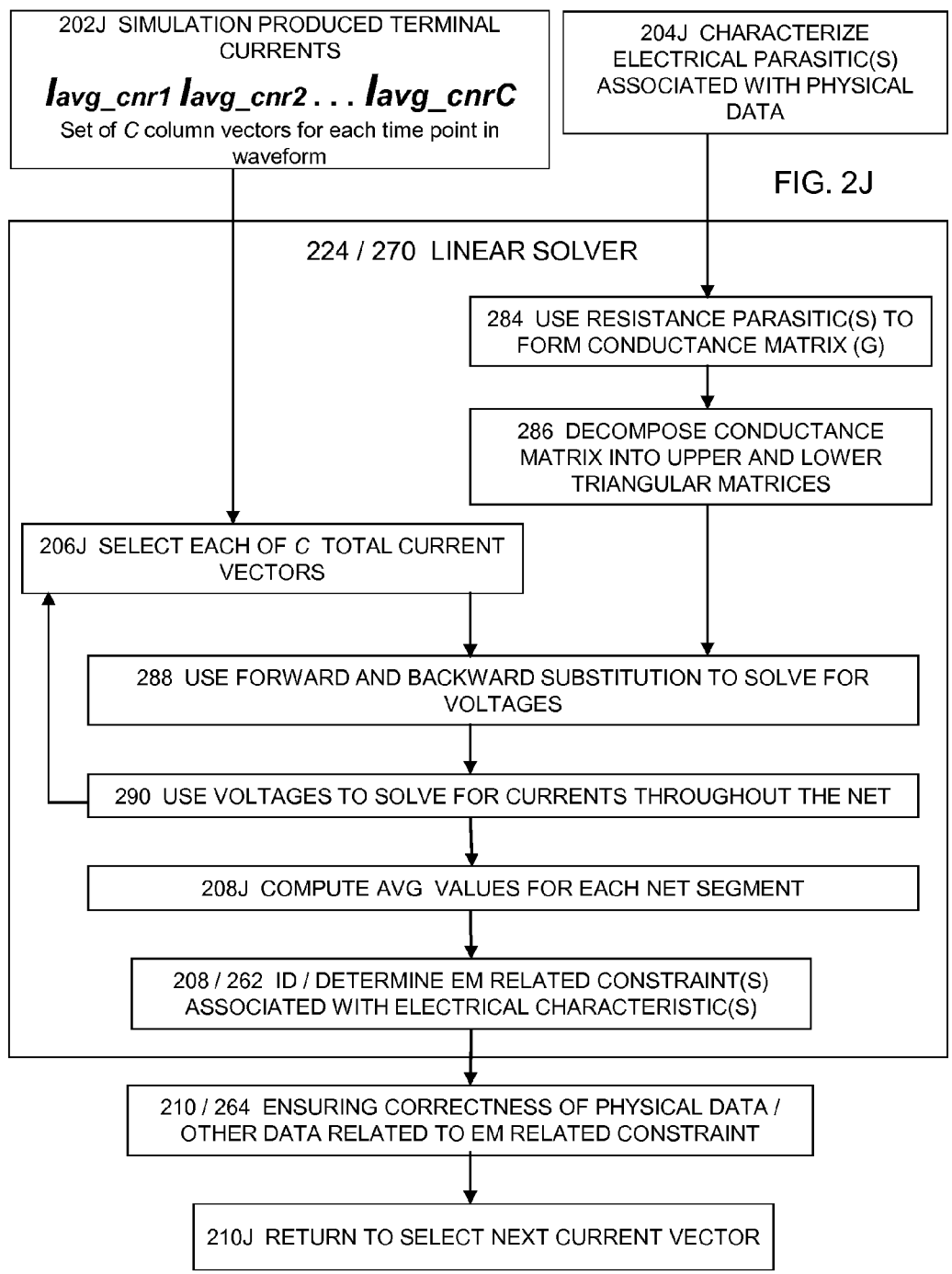

FIG. 2J illustrates a flow diagram for more detailed process or module for implementing electronic circuit design with electro-migration awareness in some embodiments. More specifically, FIG. 2J shows the example where the method or the system decomposes the electrical conductance matrix (G) once for the resistance parasitic (R) and uses the same decomposition for each of C column current vectors for corners that do not require a different resistance parasitic in some embodiments. In these embodiments, the method or the system may comprise identifying or determining a set of C column current vectors $(I_{avg\_cnr1}, I_{avg\_cnr1} \ldots I_{avg\_cnrC})$ that represent an average current vector for each of C corner values 202J. The method or the system may further comprise identifying or selecting a column current vector from the set of C column current vectors at 206 J. In addition, the method or the system may further comprise characterizing one or more electrical characteristics that are associated with the physical data of a component in at least a portion of the physical design of an electronic circuit design at 204J in a substantially similar manner as those in some preceding paragraphs with reference to FIGS. 2A-H.

The method or the system may also comprise using the one or more electrical parasitics (the resistance parasitics in this example as illustrated in FIG. 2J) to for a matrix. In some embodiments that encompass this example in FIG. 2J, the method or the system comprises using the resistance parasitics to construct an electrical conductance matrix (G) in a substantially similar manner as that of 284 described in some preceding paragraphs with reference to FIGS. 2A-H. In these embodiments, the method or the system may further the process or module, which are substantially similar to the process or module 286 as described in some preceding paragraphs with reference to FIGS. 2A-H, for decomposing the electrical conductance matrix into an upper triangular matrix and a lower triangular matrix.

Upon the identification or selection of a column current vector at 206J and the decomposition of the electrical conductance matrix at 286, the method or the system may comprise the process or module, which are substantially similar to the process or module 288 as described in some preceding paragraphs with reference to FIGS. 2A-H, using forward and backward substitution to solve for some electrical characteristics in some embodiments. In some embodiments encompassing the example as illustrated in FIG. 2J, the electrical characteristics being solved for comprise various voltages. In these embodiments, the method or the system may further comprise the process or module, which are substantially similar to the process or module 290 as described in some preceding paragraphs with reference to FIGS. 2A-H, for using the various voltages that are determined at 288 to solve for current(s) throughout the component of interest at 290. The method or the system may further determine whether there exist more column current vectors in the set of C column current vectors in some embodiments. The method or the system may then loop back to 206J to identify or select another column current vector from the set of C column current vectors in some embodiments where it is determined that there still exist some column current vectors in the set.

In some embodiments where the component of interest is identified to be a net, the method or the system may further comprise the process or module for determining the RMS value(s) for each segment of the net at 208J. The method or the system may further comprise the process or module, which are substantially similar to the process or module 208 or 262 as described in some preceding paragraphs with reference to FIGS. 2A-H, for identifying or determining one or more EM related constraints that are associated with the one or more electrical characteristics in one or more embodiments. The process or module may further comprise ensuring the correctness of the physical data or other data related to the one or more EM related constraints in a manner that is substantially similar to that of 210 or 264 as described in some of the preceding paragraphs in some embodiments. At 210J, the method or system may further return to select the next current vector in some embodiments.

In some embodiments, the method or system performs various processes or invokes various modules as described herein with reference to various figures for implementing electronic circuit design while maintaining electro-migration awareness on a net by net basis. In these embodiments, the method or system performs various actions while operating on a partial layout that does not and will not pass the LVS check or verification. For example, various processes or modules need only a single net to perform their intended functions and to achieve their intended purposes. In other words, various processes or modules described herein may be invoked to implement the electronic circuit design even when the physical design (e.g., the layout) contains the very first net in some embodiments.

Figure 3A:
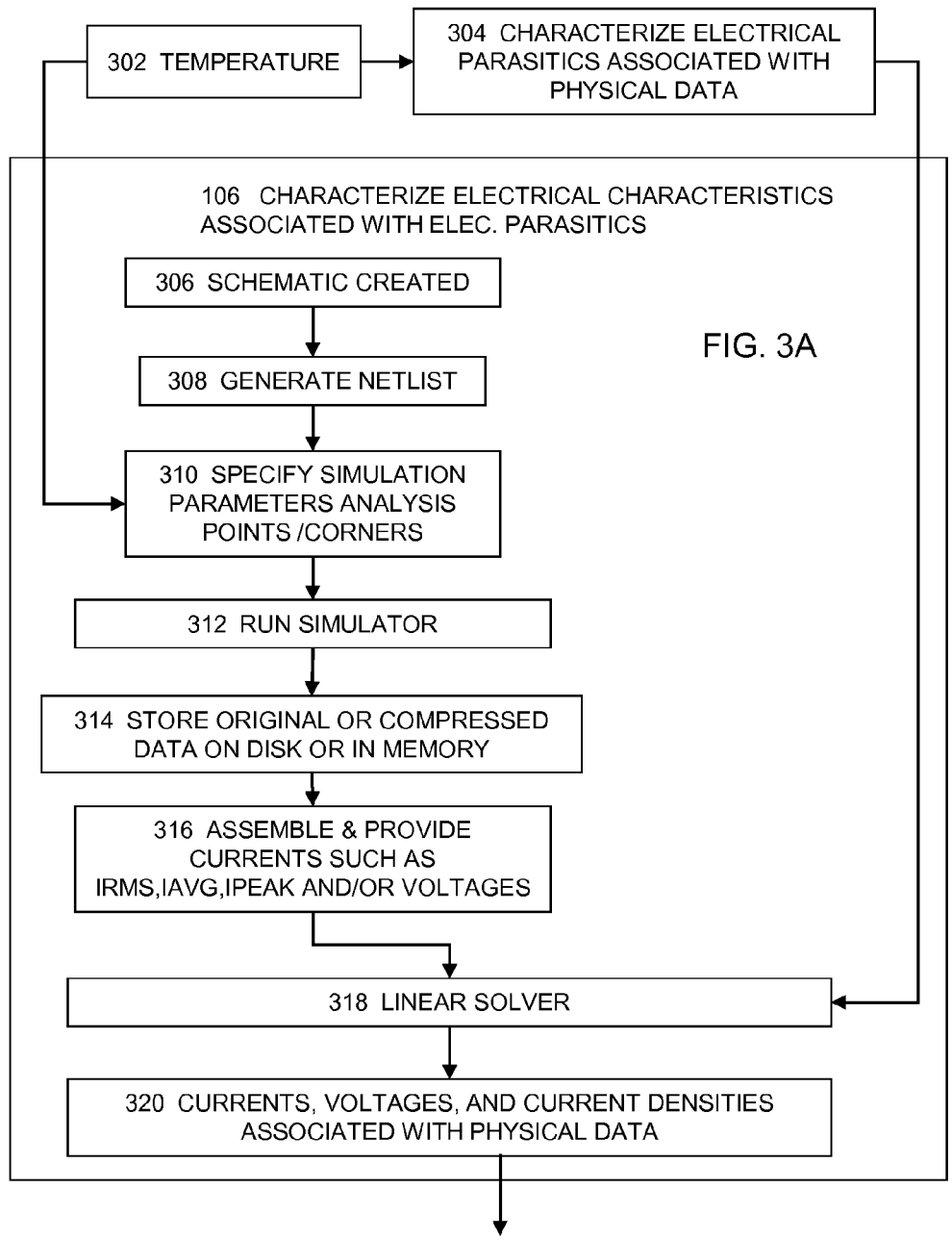
FIGS. 3A-B illustrate more details for the process or module for characterizing one or more electrical characteristics that are associated with one or more electrical parasitics in some embodiments.
Figure 3B:
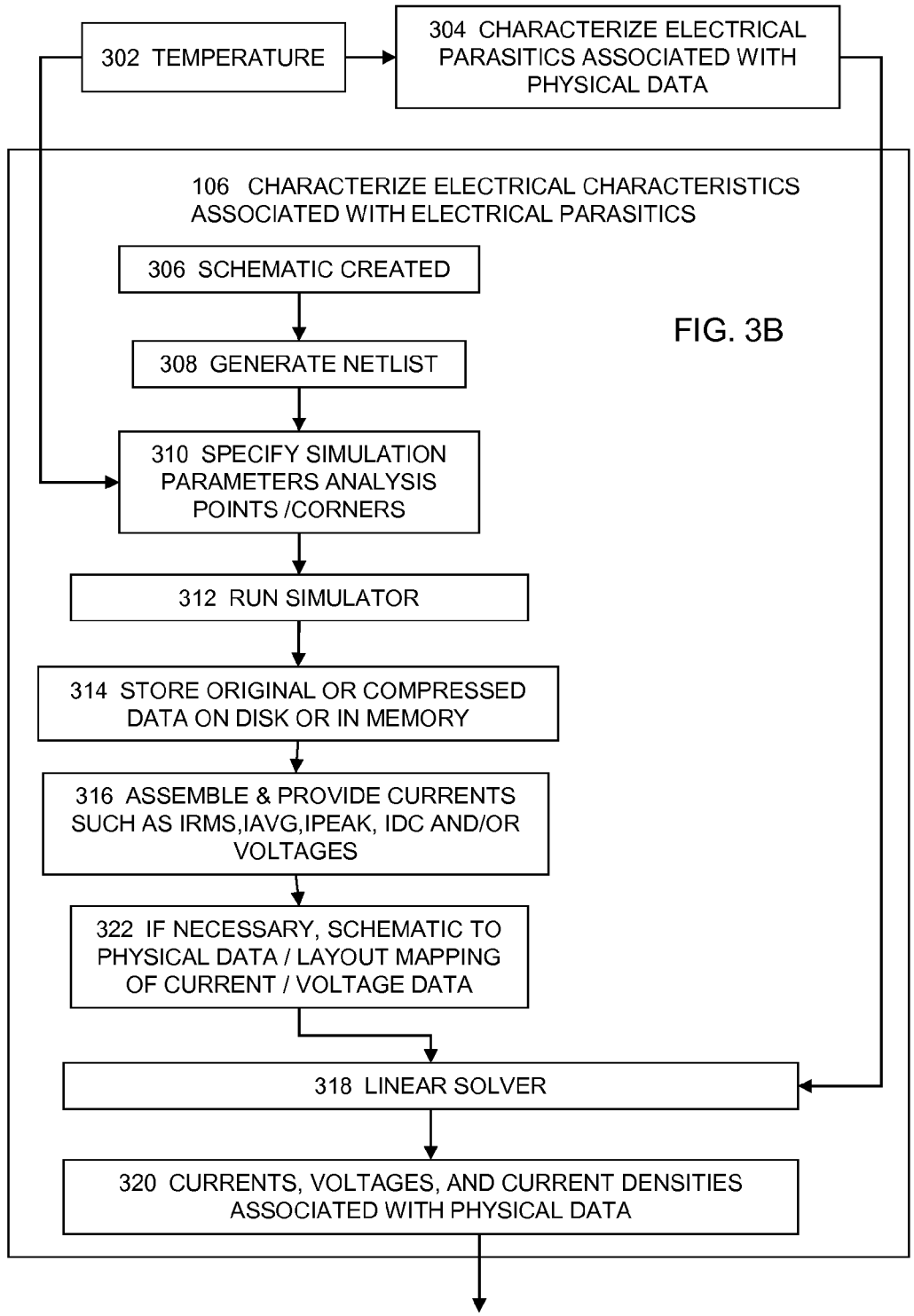

Referring to FIGS. 3A-B which illustrate more details for the process or module for characterizing one or more electrical characteristics that are associated with one or more electrical parasitics in some embodiments, the process or module 106 for characterizing one or more electrical characteristics associated with one or more electrical parasitics comprises identifying or determining temperature or thermal data at 302 and imparting the temperature or thermal data into the process or module of characterizing one or more electrical parasitics associated with the physical data at 304. For example, the method or the system may identify or determine the maximum or average operating temperature via, for example device environmental specification, a Joule heating model, or a heat transfer model, for an interconnect segment, use the temperature to more accurately determine the electrical resistivity which is in turn used to more accurately determine the electrical resistance of the interconnect segment.

The process or module 106 identifies the schematic of the electronic circuit at 306 and generates a netlist at 308 in some embodiments. The process or module 106 may then identify one or more simulation parameters or analysis points or corners for the simulation(s) at 310 and then invokes one or more simulators to perform simulation(s) at the schematic level to determine, for example, the current and voltage for each terminal of a device in some embodiments. In some embodiments, the process or module at 310 may optionally comprise separating the nets into power nets and signal nets. The process or module may then use, for example, a transistor level simulator to perform simulations for the signal net(s) and a matrix solver to solve for the currents, voltages, etc. for the power/ground nets because the power/ground nets are usually larger than the signal nets and thus may contain many resistors and capacitors and further because the power/ground nets usually carry sufficiently constant currents such that the EM analysis of the power/ground nets may be adequately ascertained by using a DC current density.

The process or module 106 may further comprises performing simulation(s) at the schematic level in some embodiments at 312 and storing the original or compressed simulation result(s) or data in a non-transitory computer readable storage medium at 314. In various embodiments, a schematic circuit may be created and simulated to determine the electrical characteristics (such as the currents or voltages) of the circuit. In some embodiments as described herein, this may be done any time prior to solving for the electrical characteristics of the physical design. In these embodiments, simulation may be done upon completion of the schematic, and in this flow that simulation data or results may be stored in a database for retrieval later. The simulation is operated at particular corners and analysis points, such as temperature, and the same settings are used during parasitic extraction.

At 316, the process or module 106 may further comprise assembling and providing the electrical characteristics, such as the currents (e.g., the RMS currents, peak currents, average currents) or voltages, to the physical design in some embodiments. The process or module may then use a solver, for example a linear matrix solver, to solve for the electrical characteristics of the physical design of the electronic design at 318 in some embodiments. In some embodiments, the electrical characteristics comprise current(s), voltage(s), or current density (densities) that is associated with the physical data.

FIG. 3B illustrates a similar flow diagram for the process or module 106 of characterizing one or more electrical characteristics that are associated with one or more electrical parasitics in some embodiments. The process or module 106 may further optionally comprise mapping schematic data to physical data or layout at 322. For example, the process or module 106 may map the currents or voltages identified or determined at the schematic level simulation to the physical data or layout to impart such schematic level data or results into the linear solver 318 in order for the linear solver 318 to determine the currents, voltages, or current densities at the physical level at 320.

Figure 4:
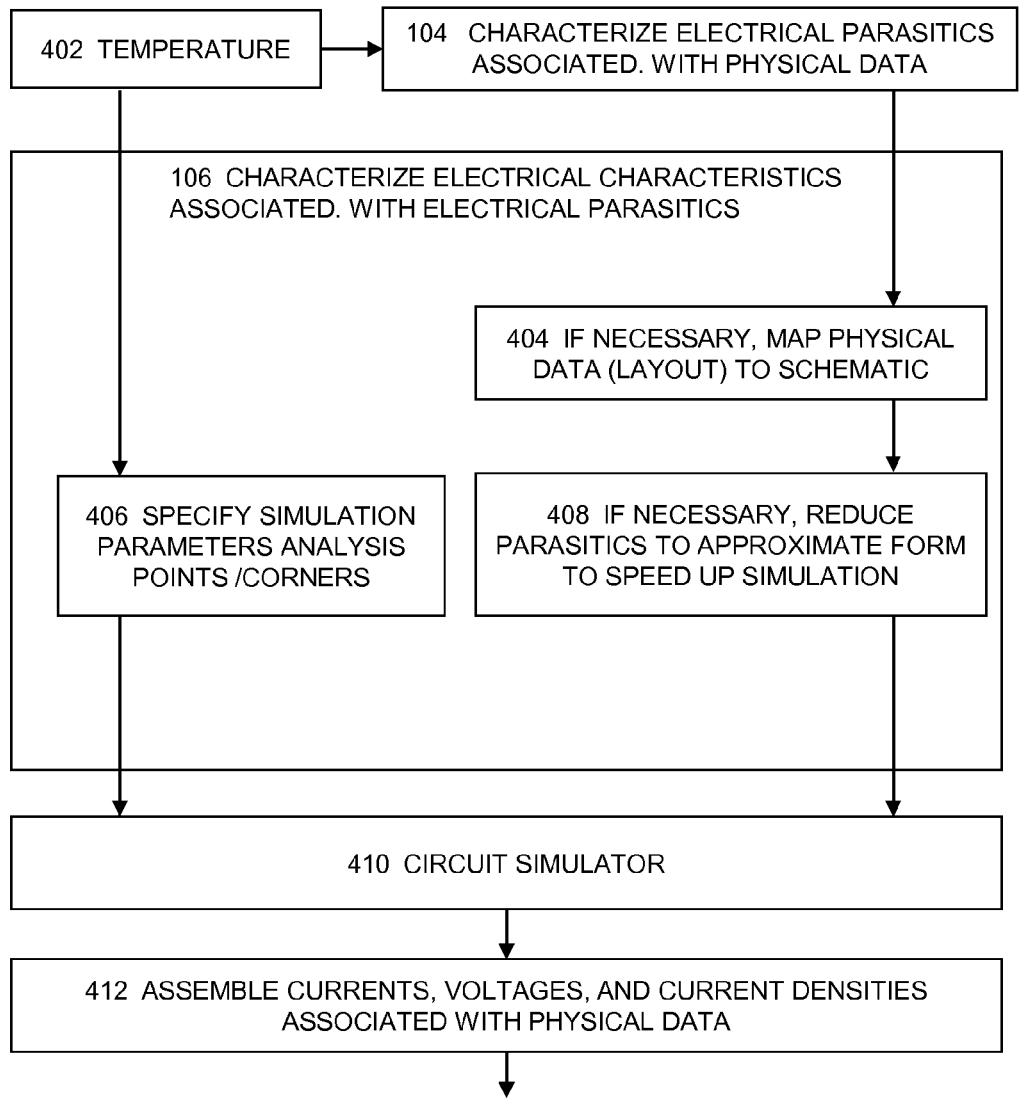
FIG. 4 illustrates more details for the process or module for characterizing one or more electrical parasitics associated with the physical data and for characterizing one or more electrical characteristics that are associated with one or more electrical parasitics in some embodiments.

Referring to FIG. 4 which illustrates more details for the process or module for characterizing one or more electrical parasitics associated with the physical data and for characterizing one or more electrical characteristics that are associated with one or more electrical parasitics in some embodiments, the process or module 106 may comprise the process or module 106 for characterizing one or more electrical characteristics associated with one or more electrical parasitics comprises identifying or determining temperature or thermal data at 402 and imparting the temperature or thermal data into the process or module of characterizing one or more electrical parasitics associated with the physical data at 104 of FIG. 1A. In some embodiments, thermal maps where the estimated operating temperature varies across a device may be applied locally to estimate the correct parasitic elements. For example, certain resistances or capacitances may be expressed in terms of temperatures to characterize their temperature dependence. In some embodiments, various temperature or thermal data may also be imparted into the process or module of identifying or determining one or more EM related constraints that are associated with one or more electrical characteristics such as those in the processes or modules 208 or 262. In some embodiments, the process or the module may use one or more maximum temperature for each, for example but not limited to, terminal to identify or determine the one or more EM related constraints. In some embodiments, the process or the module may use one or more average temperatures to identify or determine the one or more EM related constraints. In some embodiments, the process or the module may use one or more appropriate temperatures, which is (are) determined based at least in part upon, for example, the predicted or guaranteed life of the electronic device, to identify or determine the one or more EM related constraints.

The temperature or thermal data may further be imparted into the process or module for specifying simulation parameters or analysis points or corners at 406 in some embodiments. The simulation parameters or analysis points or corners may then be further imparted to the process or module 410 which performs one or more simulations at the schematic level. In addition, the process or module 106 may further comprise mapping physical data or layout information to schematic level data at 404 in some embodiments. At 408, the process or module 106 may further optionally comprise reducing the parasitics to an approximate form to speed up physical level simulation(s) that is to be performed at 410 in some embodiments. At 412, the method or system may further comprise determining or assembling the current(s), voltage(s), or current density (densities) that is (are) associated with the physical data in some embodiments.

In some embodiments where the method or system incorporates both the processes or modules as illustrated in FIGS. 3A-B and 4, the physical data, the electrical parasitics, or the electrical characteristics are passed between the schematic domain and the physical domain such that both the schematic domain tools (such as a schematic level simulator) and the physical domain tools (such as the placement tool, the router, or the physical level simulators, etc.) are aware of such data while the physical design/layout is being implemented. In other words, as the physical design is being implemented, more physical layout components will be implemented into the layout. As a result, more electrical parasitics and thus electrical characteristics become available as the physical design is being implemented. Therefore, both the schematic level tools and the physical domain tools such that these tools take such data into account while the physical design is being implemented and thus possess a unique advantage over conventional approaches where the physical data, the electrical parasitics associated with the physical data, and electrical characteristics associated with the electrical parasitics are not considered until the post-layout design stages such as a post-layout physical verification stage.

Figure 5:
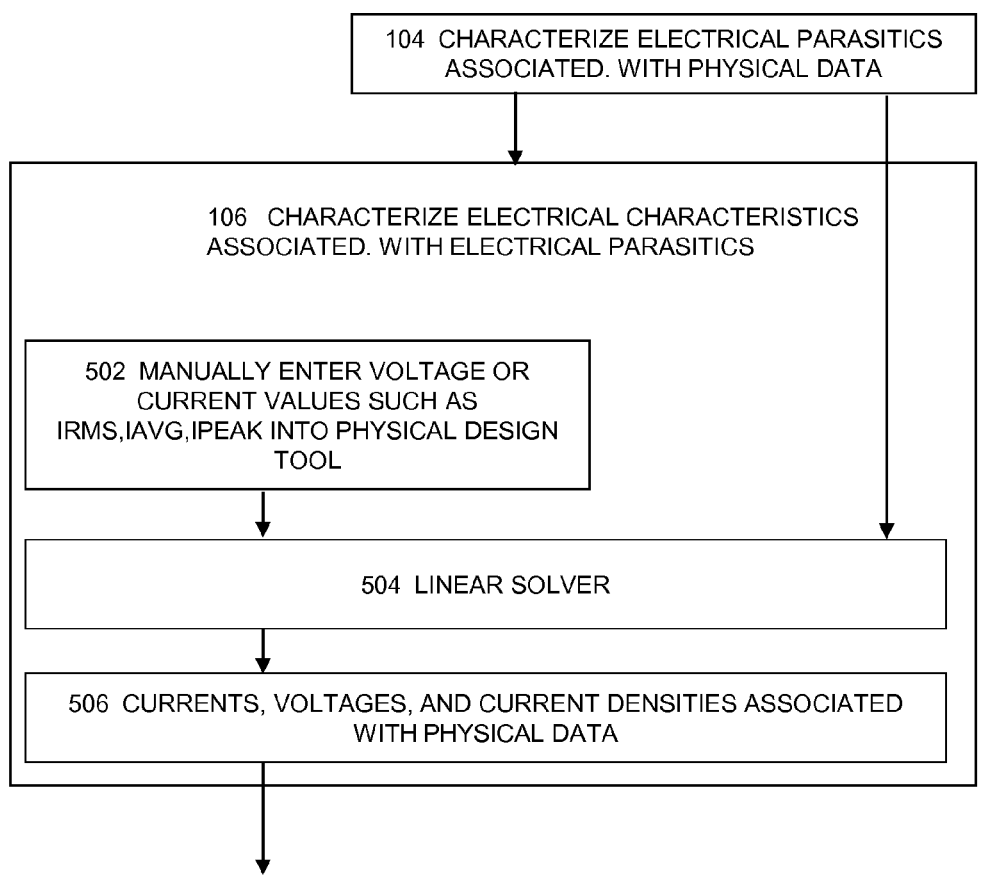
FIG. 5 illustrates more details for the process or module for characterizing one or more electrical parasitics associated with the physical data and for characterizing one or more electrical characteristics that are associated with one or more electrical parasitics in some embodiments.

Referring to FIG. 5 which illustrates more details for the process or module for characterizing one or more electrical parasitics associated with the physical data and for characterizing one or more electrical characteristics that are associated with one or more electrical parasitics in some embodiments, the process or module 106 may further comprise the process or module for manually entering voltage or current values or vectors (such as the RMS currents, the peak currents, the average currents, or the current waveforms, etc.) into the physical design at 502 in some embodiments. In one embodiment the user/designer may do 'what-if' analysis where currents and voltages may be manually entered for one or more nets where they don't exist or modified where they do exist. In this use model, the designer can intentionally modify these values to examine electrical parameter sets not computed or provided by simulation. In some cases, the person performing layout may not have access to simulation data but still wants to examine the impact of manually entered electrical parameters.

At 504, the manually entered voltages or currents are passed along into a linear solver to characterize the electrical characteristics in some embodiments. The linear solver may also consider one or more electrical parasitics that are characterized at 104 in characterizing the electrical characteristics that are associated with the electrical parasitics in some embodiments. At 506, the process or module 106 may further comprise the process or module for assembling or determining the current(s), voltage(s), or current density (densities) that are associated with the physical data in some embodiments.

Figure 6:
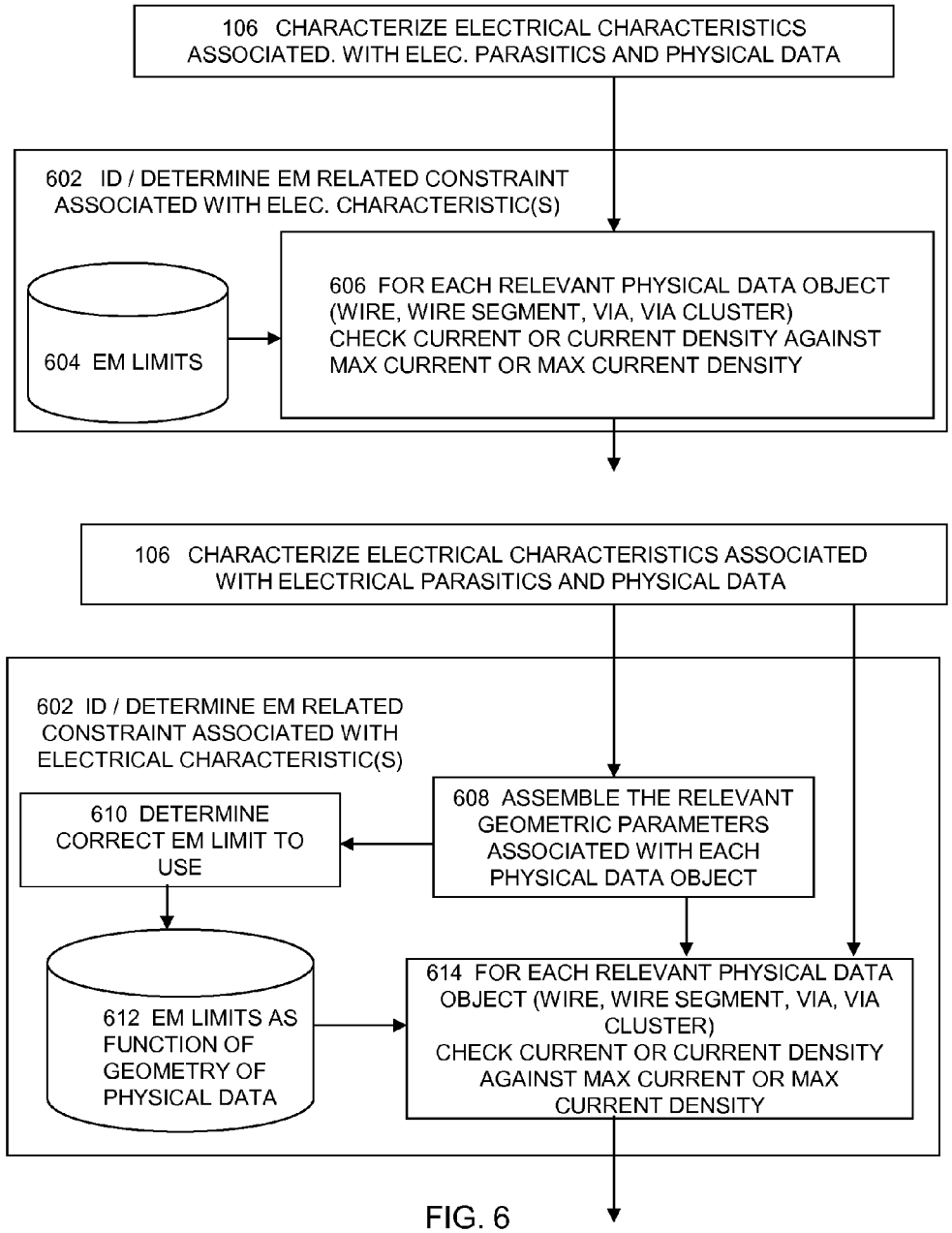
FIG. 6 illustrates more details for the process or module for implementing electronic circuit design with electro-migration awareness in some embodiments.

Referring to FIG. 6 which illustrates more details for the process or module for implementing electronic circuit design with electro-migration awareness in some embodiments, the method or system for implementing electronic circuit design with electro-migration awareness comprises identifying or determining one or more EM related constraints that are associated with the characterized electrical characteristics at 602. At 604, the method or the system identifies or retrieves one or more EM related constraints. In some embodiments where the one or more EM related constraints are provided in the form of limits on current densities, the method or the system for implementing electronic circuit designs may further comprise checking the current or current density of a physical object against the one or more EM related constraints at 606. It shall be noted that the system is aware of the physical data, such as the width, length, or cross-sectional area of a circuit component at the physical level such as wire, via or via cluster, and thus the one or more EM related constraints may be provided in either current density format or current format. Some embodiments may use physical data geometry to convert current density limits to maximum current(s) for a given object geometry so that the user can work solely with currents a metric that may be relate better or more intuitively to the expected circuit behavior.

FIG. 6 further illustrates more details for the process or module 602 for identifying or determining one or more EM related constraints that are associated with the characterized electrical characteristics associated with the characterized electrical parasitics and physical data. Once the process or module 106 characterizes one or more electrical characteristics that are associated with the one or more characterized electrical parasitics and physical data, the method or the system for implementing electronic circuit designs with electro-migration awareness proceeds to 608 to invoke a process or module for assembling or providing the relevant geometric parameters that are associated with the net, device, or component associated with the physical data of interest in a single embodiment or in some embodiments. In some embodiments, the relevant geometric parameters comprise a distance or length for the net, device, or component, which length represents the lower limit for the length of an interconnect below which electro-migration is not a concern. The length or distance may comprise the Blech length. In some embodiments, the relevant geometric parameters may comprise the arrangement of a via array because the arrangement affects the distribution of current through each via in the via array. In some embodiments, the relevant geometric parameters comprise the corner bend configuration of an interconnect. For example, the electro-migration in an interconnect with a rounded corner bend configuration is less severe than that in a tapered bend configuration, which is in turn less severe than a corner bend of right angles. Therefore, some adjustments may need to be made in light of the corner bend configurations of a particular interconnect. In some embodiments, the relevant geometric parameters comprise the orientation of the component. For example, the orientation of a component in a circuit design may affect certain directions of the grain boundary in the component and thus give rise to different severity of electro-migration.

The method or the system may optionally proceed to 610 to invoke the process or module for determining one or more correct EM limits or EM related constraints to use in subsequent process(es) or module(s) in some embodiments. In some embodiments, an EM limit or constraint may be identified as a simple numerical value such as a maximum current density or maximum density. In some other embodiments, an EM limit or constraint may be identified as a function or functional of geometry of the net, device, or component associated with the physical data 612. For example, the lengths of certain wires or interconnects may be under the Blech length, and thus electro-migration is not a concern for such wires or interconnects. For example, an EM related constraint may be provided as a function of via groups or arrays. For example, an EM related constraint may be provided as a function of the net attribute such as signal, power/ground. For example, an EM related constraint may be provided as a function of the duty or pulse characteristics of a particular signal.

In some embodiments, the process or module 602 further comprises determining whether the one or more characterized electrical characteristics meet the one or more EM related constraints or limits for an object associated with the physical data (such as a wire, a wire segment, a via, or a via cluster) at 614. For example, the process or module 602 may check a wire segment or a via to determine whether the current (such as the RMS current, the peak current, the average current, or the current waveform) or the current density meets the corresponding maximum current or current density constraint.

Therefore, the method or the system as illustrated in FIG. 6 depicts an approach that for each physical data object, e.g. wire segment, via, via cluster, currents or current densities in the physical data object may be compared with the maximum current or maximum current density limits that are prescribed in one or more EM related constraints in some embodiments. In some embodiments, the EM limits or constraints may be based on geometric characteristics of the physical data, for example some wire segments may be under the Blech length and thus EM is not a factor. In other cases, there are wire width and length based EM limits and via cluster and via overlap related limits and relaxing products on the limits as well.

Moreover, the limits or constraints are compared to the electrical characteristics. The method or the system further provides the capability to notify the user through a graphical user interface when the limits or constraints are exceeded in some embodiments. When the current or current density associated with a physical data, e.g. wire segment, is exceeded, the physical geometries, e.g. wire width, of the data object may be computed such the limit is not exceeded in some embodiments. In addition, these changes may be displayed as a hint to the user for manual fixing or the changes may be made automatically in some embodiments.

Furthermore, the EM checking flow as described herein may be used as part of the manual or automatic routing or post-route optimization of a design, for example during design of a block or integration activity in some embodiments. In this flow each route is created, checked for EM correctness and if necessary corrected before moving to the next route in these embodiments. The EM checking flow as described herein in various embodiments may be further combined with current, voltage, resistance, or capacitance constraints that are created or identified prior to physical design.

Figure 7:
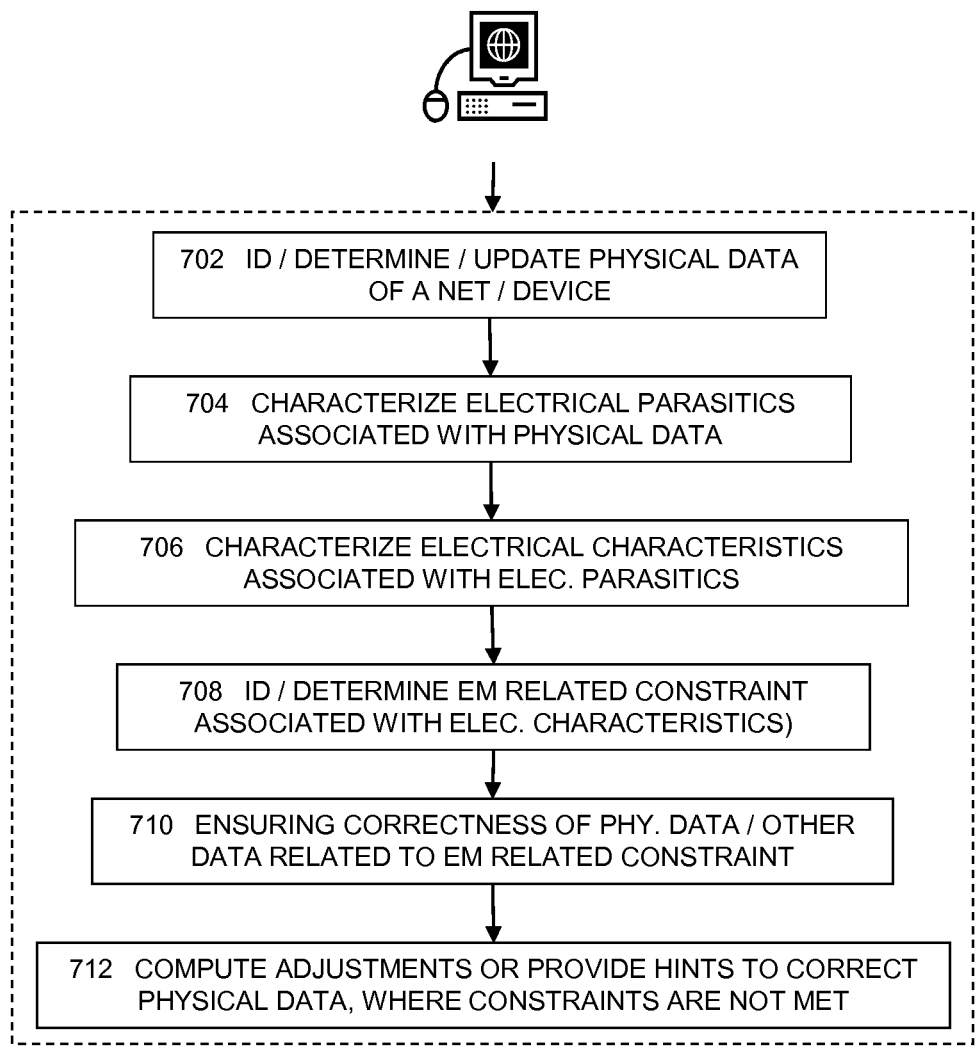
FIG. 7 illustrates a more detailed flow diagram for the method or system for implementing electronic circuit designs with electro-migration awareness.

Referring to FIG. 7 which illustrates a more detailed flow diagram for the method or system for implementing electronic circuit designs with electro-migration awareness, the method or the system for implementing electronic circuit designs with electro-migration awareness comprises the process or module of identifying, determining, updating the physical data of a net, a device, or a component of the electronic circuit design at 702 in a single embodiment or in some embodiments. The method or the system may further comprise the process or module of characterizing one or more electrical parasitics associated with the physical data at 704 and the process or module of characterizing one or more electrical characteristics associated with the one or more electrical parasitics at 706 in a single embodiment or in some embodiments. The method or the system may further comprise the process or module of identifying or determining one or more EM related constraint associated with the one or more electrical characteristics at 708 in some embodiments. The method or the system may further optionally comprise the process or module of ensuring correctness of the physical data or other data related to the one or more EM related constraints in some embodiments at 710. The details of the processes or modules of 702, 704, 706, 708, and 710 have been described in previous paragraphs with reference to FIGS. 1-6 and will not be repeated here.

In some embodiments where at least a part of the physical data is determined not to meet the one or more EM related constraints or is determined to be incorrect, the method or the system may further optionally comprise the process or module of computing or determining one or more adjustments or providing one or more hints to correct the physical data at 712. For example, if the current density for a wire segment with a width of 0.12 μm is determined to have failed a current density EM constraint, the method or the system may determine or compute one or more adjustments to the width which, when made, will cause the wire segment to meet the current density EM constraint or may provide a hint, such as widen the width of the wire segment to 0.16 μm, or simply widen the width of the wire segment without specific numerical values, or reconfigure the bend at (x, y) location, to the user such that the user may know where the EM violation is and/or how to fix the EM violation.

Figure 8:
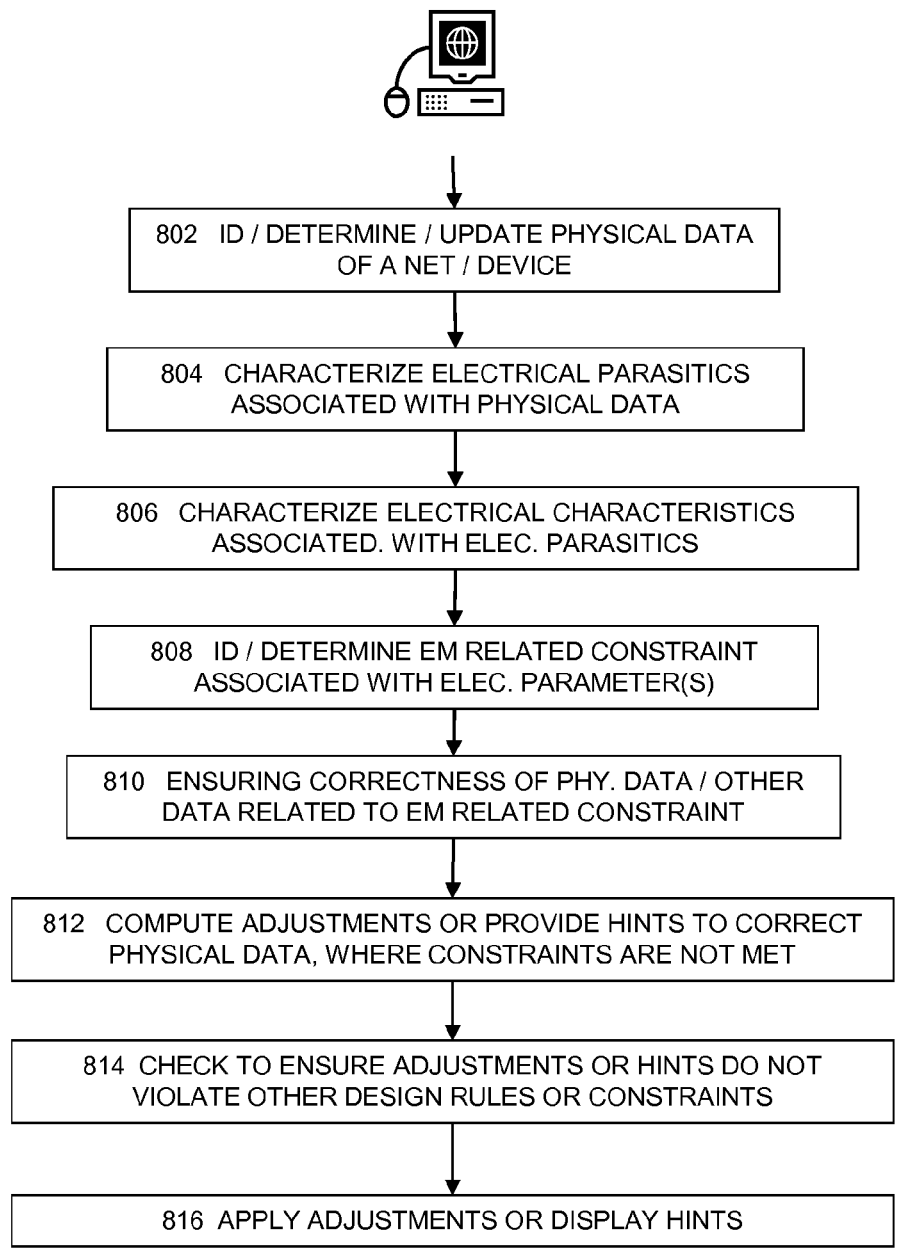
FIG. 8 illustrates a more detailed flow diagram for the method or system for implementing electronic circuit designs with electro-migration awareness.

Referring to FIG. 8 which illustrates a more detailed flow diagram for the method or system for implementing electronic circuit designs with electro-migration awareness, the method or the system for implementing electronic circuit designs with electro-migration awareness comprises the process or module of identifying, determining, updating the physical data of a net, a device, or a component of the electronic circuit design at 802 in a single embodiment or in some embodiments. The method or the system may further comprise the process or module of characterizing one or more electrical parasitics associated with the physical data at 804 and the process or module of characterizing one or more electrical characteristics associated with the one or more electrical parasitics at 806 in a single embodiment or in some embodiments.

The method or the system may further comprise the process or module of identifying or determining one or more EM related constraint associated with the one or more electrical characteristics at 808 in some embodiments. The method or the system may further optionally comprise the process or module of ensuring correctness of the physical data or other data related to the one or more EM related constraints in some embodiments at 810. In some embodiments where at least a part of the physical data is determined not to meet the one or more EM related constraints or is determined to be incorrect, the method or the system may further optionally comprise the process or module of computing or determining one or more adjustments or providing one or more hints to correct the physical data at 812. The details of the processes or modules of 802, 804, 806, 808, 810, and 812 have been described in previous paragraphs with reference to FIGS. 1-6 and will not be repeated here.

In some embodiments, the method or the system may further optionally comprise the process or module of determining or checking to ensure whether or not one or more adjustments or hints violate other one or more design rules or constraints at 814. For example, an EM violation may result in the widening of a wire to reduce the current density below a limit but may also increase coupling capacitance to an adjacent neighbor beyond an established constraint. At 816, the method or the system may proceed to apply the one or more adjustments to fix the physical design in some embodiments, or may display one or more hints to the user in some other embodiments.

For example, in the embodiments where the method or the system determines that the one or more adjustments determined at 812 do not cause violations of other design rules or constraints, the method or the system may apply the one or more adjustments to fix the physical data at 816. In the alternative, in some embodiments where the method or the system determines that the one or more adjustments determined or computed at 812 violate one or more other design rules or constraints, the method or the system may still apply the one or more adjustments to fix the physical data and present the violations of the one or more other design rules or constraints to the user. Moreover, in these embodiments where the method or the system determines that the one or more adjustments determined or computed at 812 violate other design rules or constraints, the method or the system may further fine tune the one or more adjustments determined or computed at 812 or may determine or compute other adjustments to address the violations caused by the one or more adjustments. In these embodiments, the method or the system may further optionally present one or more hints involving these other adjustments to the user or may apply these other adjustments to fix the violations caused by the one or more adjustments determined or computed at 812.

Figure 9:
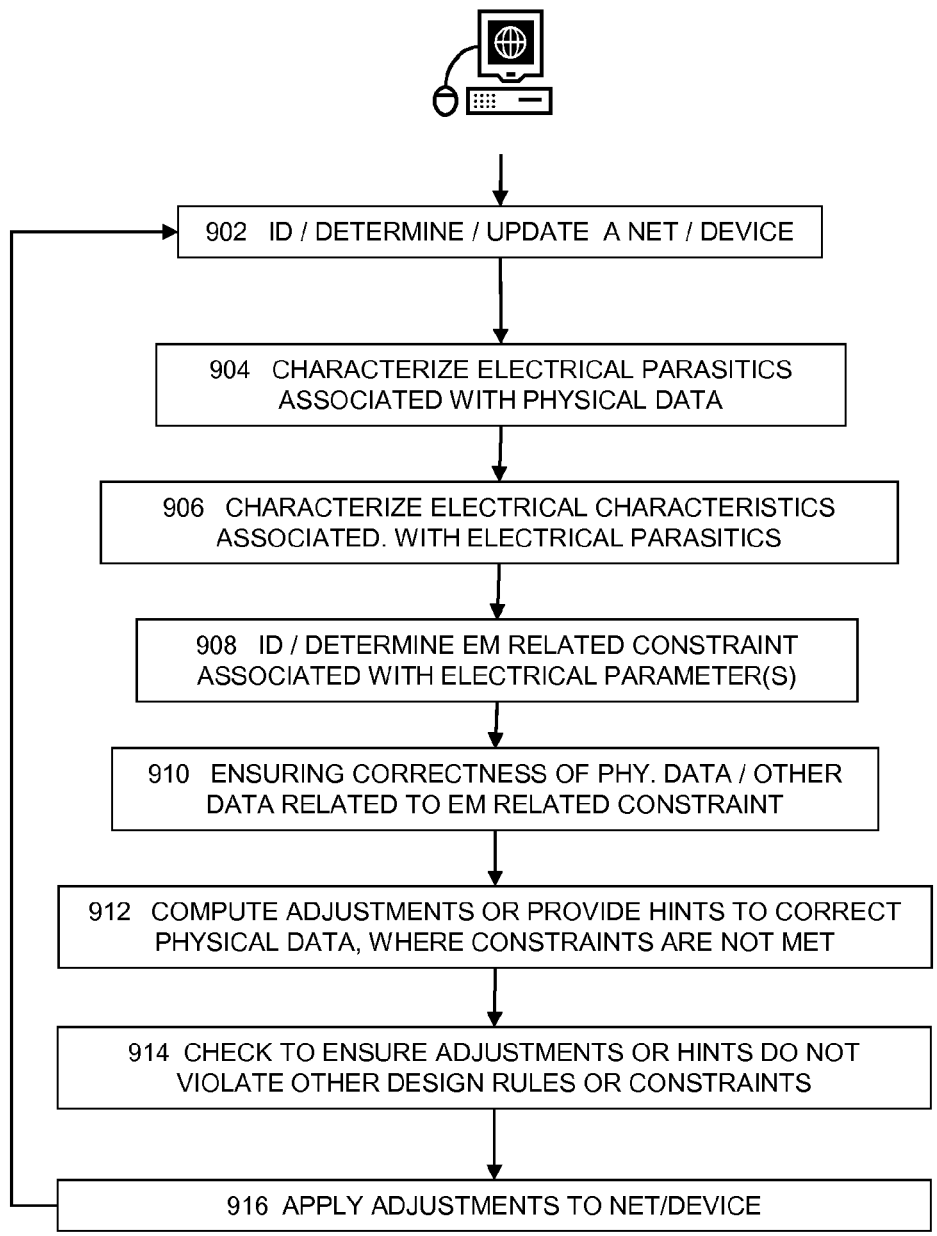
FIG. 9 illustrates a more detailed flow diagram for the method or system for implementing electronic circuit designs with electro-migration awareness.

Referring to FIG. 9 which illustrates a more detailed flow diagram for the method or system for implementing electronic circuit designs with electro-migration awareness, the processes or modules 902, 904, 906, 908, 910, 912, and 914 correspond to the substantially similar processes or modules 802, 804, 806, 808, 810, 812, and 814 and thus will not be repeated here to avoid duplication of records. The method or the system for implementing electronic circuit designs with electro-migration awareness may further comprise the process or module of applying the one or more adjustments that are determined or computed at 912 to the net, device, or component or the associated physical data at 916 in some embodiments.

Once the one or more adjustments are applied to meet the one or more EM related constraints, the method or the system may further loop back to 902 to further determine whether there exist a need to further identify or determine another net, device, or component, or whether the existing identified or determined net, device, or component needs to be updated after the application of the one or more adjustments at 912. The method or the system then proceeds through the process flow as described in various embodiments with reference to various figures until the physical design is complete. In various embodiments, the method or the system implements the physical design of an electronic circuit while being aware of electro-migration related constraints or rules in some embodiments. That is, the method or the system is aware of the electro-migration related design rules or constraints while the method or the system is implementing the nets, devices, components, or even the first net, first device, or first component into the physical design of the electronic circuit design.

System Architecture Overview

Figure 10:
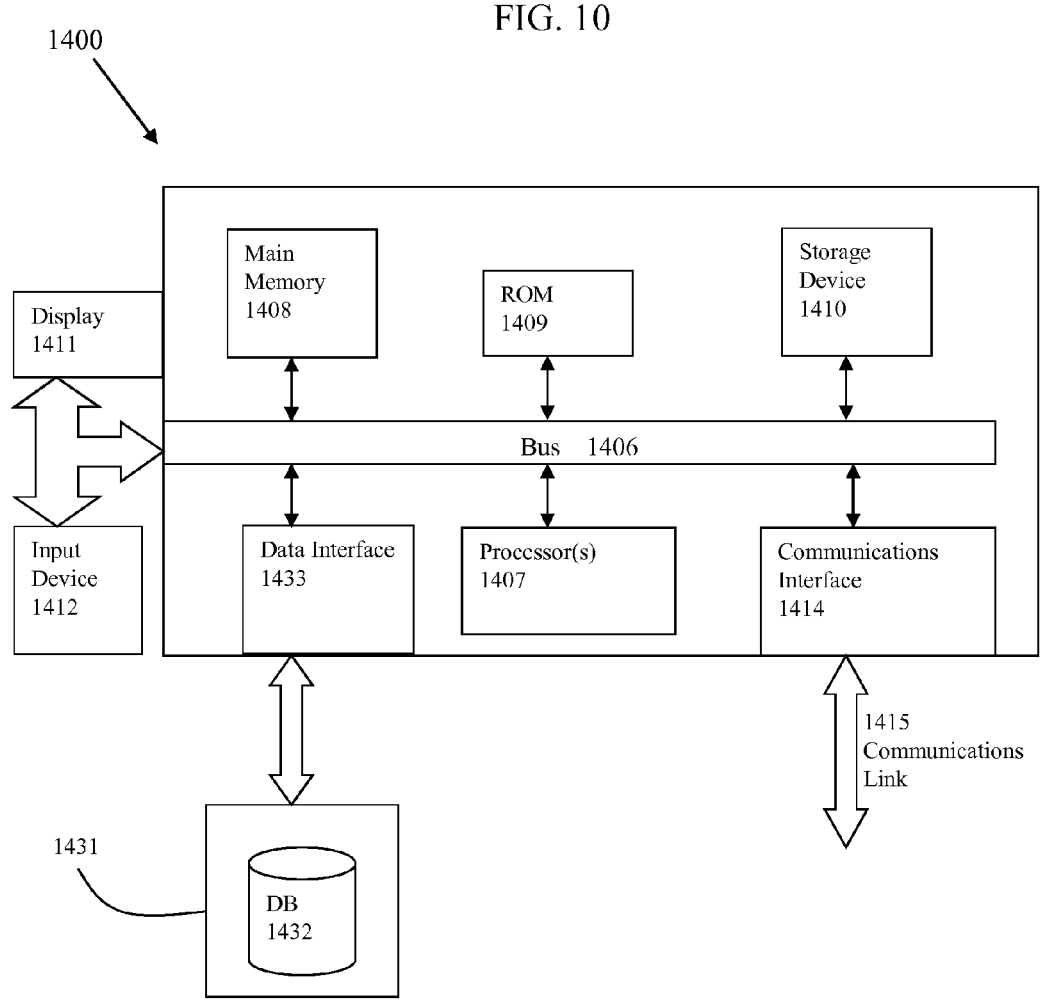
FIG. 10 depicts a computerized system on which a method for timing closure with concurrent process models may be implemented.

FIG. 10 illustrates a block diagram of an illustrative computing system 1400 suitable for implementing some embodiments of the method or system for implementing electronic circuit designs with electro-migration awareness as described in the preceding paragraphs with reference to various figures. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment, computer system 1400 performs specific operations by one or more processor or processor cores 1407 executing one or more sequences of one or more instructions contained in system memory 1408. Such instructions may be read into system memory 1408 from another computer readable/usable storage medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1407, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout shapes or nets are created or modified.

The term "computer readable storage medium" or "computer usable storage medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals that include data streams representing various types of signal information, e.g., instructions, messages and data. In embodiments of the invention, the functions of the data interface 1433 may be performed by the communication interface 1414.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing an electronic circuit design with electro-migration awareness, comprising:

using at least one processor that is programmed for performing a process comprising:

implementing an interconnect by identifying, determining, or updating physical data of the interconnect of a partial physical design that represents the electronic circuit design;

characterizing an electrical parasitic that is associated with the physical data of the interconnect;

providing electro-migration information for the interconnect, while the interconnect is being implemented in the partial physical design, to a physical implementation tool to implement the interconnect in the partial physical design by at least characterizing an electrical characteristic associated with the electrical parasitic, wherein the electronic circuit design includes a layout that is represented by the partial physical design, and at least one circuit component is absent from a net including the interconnect in the partial physical design representing the layout, wherein the layout does not pass a layout-versus-schematic check with a corresponding schematic design due to absence of the at least one circuit component from the layout; and implementing, at an electro-migration aware design automation module stored at least partially in memory and functioning in conjunction with at least the at least one processor of a computing system, the net including the interconnect at least by applying an adjustment to the interconnect based in part or in whole upon the electro-migration information for the interconnect while saving one or more computing resources when the electro-migration information is determined to violate one or more electro-migration related constraints.

2. The computer implemented method of claim 1, the process further comprising:

displaying the electrical characteristic associated with the physical data of the interconnect or storing the electrical characteristic in a non-transitory computer readable storage medium.

3. The computer implemented method of claim 1, the process further comprising:

identifying or determining an electro-migration related constraint that is associated with the electrical characteristic.

4. The computer implemented method of claim 3, wherein the act of identifying or determining the electro-migration related constraint that is associated with the electrical characteristic comprises:

determining whether the electrical characteristic or other data related to the electro-migration related constraint meets a requirement of the electro-migration related constraint for the interconnect.

5. The computer implemented method of claim 4, the process further comprising:

identifying or determining one or more relevant geometric parameters related to the interconnect; and identifying or determining whether to analyze the interconnect using the electro-migration related constraint based at least in part upon the one or more relevant geometric parameters.

6. The computer implemented method of claim 3, in which the electro-migration related constraint is determined based at least in part upon a shape or a set of shapes on a net at a time when the net is created or completed.

7. The computer implemented method of claim 1, the process further comprising:

ensuring correctness of the physical data or other data that are related to the electro-migration related constraint.

8. The computer implemented method of claim 1, wherein the act of characterizing the electrical characteristic that is associated with the electrical parasitic comprises:

performing simulation on the electronic circuit design at a schematic level;

creating a net on the partial physical design; and determining the electrical characteristic by using a solver.

9. The computer implemented method of claim 8, in which the act of using the solver comprises:

using at least the electrical parasitic to construct a matrix;

decomposing the matrix into an upper triangular matrix and a lower triangular matrix;

using forward and backward substitution to solve for a second electrical characteristic; and characterizing the electrical characteristic for the interconnect by using at least the second electrical characteristic.

10. The computer implemented method of claim 9, in which the matrix comprises an electrical conductance matrix, and the second characteristic comprises a voltage at a point in the partial physical design.

11. The computer implemented method of claim 10, in which the electrical characteristic comprises at least one of a maximum current and an RMS current.

12. The computer implemented method of claim 1, wherein the act of characterizing the electrical characteristic that is associated with the electrical parasitic comprises:

identifying or generating thermal data and a schematic of the electronic circuit design;

generating a netlist; and specifying one or more simulation parameters or one or more analysis points or corners.

13. The computer implemented method of claim 12, wherein the act of characterizing the electrical characteristic that is associated with the electrical parasitic further comprises:

performing a simulation at a schematic level to determine one or more schematic level electrical characteristics; and determining the electrical characteristic at a physical level based at least in part upon the one or more schematic level electrical characteristic and the electrical parasitic using a solver.

14. The computer implemented method of claim 1, wherein the act of characterizing the electrical characteristic that is associated with the electrical parasitic comprises:
   identifying thermal data for the interconnect;
   mapping the electrical characteristic at a physical level to a schematic level electrical characteristic at a schematic level;
   reducing the electrical parasitic; and
   specifying one or more simulation parameters or one or more analysis points or corners.

15. The computer implemented method of claim 1, wherein the act of characterizing the electrical characteristic that is associated with the electrical parasitic comprises:
   receiving one or more electrical data from a user; and
   determining the electrical characteristic based at least in part upon the one or more electrical data from the user by using a solver.

16. The computer implemented method of claim 1, the process further comprising:
   determining an adjustment to the physical data or to the interconnect based at least in part upon the electro-migration related constraint.

17. The computer implemented method of claim 16, the process further comprising:
   determining whether the adjustment causes one or more violations of one or more design rules or one or more constraints.

18. The computer implemented method of claim 16, the process further comprising:
   displaying a hint based at least in part upon the adjustment to a user.

19. The computer implemented method of claim 18, in which the hint is generated for application of the adjustment or for fixing the one or more violations.

20. The computer implemented method of claim 1, in which the partial physical design does not pass a layout versus schematic check or verification.

21. The computer implemented method of claim 1, in which the act of characterizing the electrical parasitic or the act of characterizing the electrical characteristic is performed before or at a time of creation of a net or modification of an existing net.

22. The computer implemented method of claim 21, wherein the act of characterizing the electrical parasitic is done before storing one or more shapes that are created or modified and constitute the net in a database.

23. The computer implemented method of claim 1, further comprising:
   verifying the electrical characteristic after completion of creation or modification of a net or a partial net and before creation or modification of a second net in the partial physical design.

24. A system for implementing an electronic circuit design with electro-migration awareness, comprising:
   at least one processor that is to:
   implement an interconnect by identify, determine, or update physical data of the interconnect of a partial physical design that represents the electronic circuit design;
   characterize an electrical parasitic that is associated with the physical data of the interconnect;
   provide electro-migration information for the interconnect, while the interconnect is being implemented in the partial physical design, to a physical implementation tool to implement the interconnect in the partial physical design by at least characterizing an electrical characteristic that is associated with the electrical parasitic, wherein
   the electronic circuit design includes a layout that is represented by the partial physical design, and at least one circuit component is absent from a net including the interconnect in the partial physical design representing the layout, wherein the layout does not pass a layout-versus-schematic check with a corresponding schematic design due to absence of the at least one circuit component from the layout; and
   implement, at an electro-migration aware design automation module stored at least partially in memory and functioning in conjunction with at least the at least one processor of a computing system, the net including the interconnect at least by applying an adjustment to the interconnect based in part or in whole upon the electro-migration information for the interconnect while saving one or more computing resources when the electro-migration information is determined to violate one or more electro-migration related constraints.

25. The system of claim 24, in which the at least one processor is further to:
   display the electrical characteristic associated with the physical data of the interconnect or storing the electrical characteristic in a non-transitory computer readable storage medium;
   identify or determine an electro-migration related constraint that is associated with the electrical characteristic; or
   ensure correctness of the physical data or other data that are related to the electro-migration related constraint.

26. The system of claim 24, wherein the at least one processor that is to characterize the electrical characteristic that is associated with the electrical parasitic is further to:
   perform simulation on the electronic circuit design at a schematic level; and
   determine the electrical characteristic by using a solver.

27. The system of claim 24, wherein the at least one processor that is to characterize the electrical characteristic that is associated with the electrical parasitic is further to:
   identify or generate thermal data and a schematic of the electronic circuit design;
   generate a netlist;
   specify one or more simulation parameters or one or more analysis points or corners;
   perform a simulation at a schematic level to determine one or more schematic level electrical characteristics; and
   determine the electrical characteristic at a physical level based at least in part upon the one or more schematic level electrical characteristic and the electrical parasitic using a solver.

28. The system of claim 26, wherein the at least one processor that is to characterize the electrical characteristic that is associated with the electrical parasitic is further to:
   identify thermal data for the interconnect;
   map the electrical characteristic at a physical level to a schematic level electrical characteristic at a schematic level;
   reduce the electrical parasitic; and
   specify one or more simulation parameters or one or more analysis points or corners.

29. An article of manufacture comprising a non-transitory computer readable storage medium having a sequence of instructions stored thereupon which, when executed by a processor, causes the processor to perform a process for implementing an electronic circuit design with electro-migration awareness, the process comprising:

using at least one processor that is programmed for performing the process that comprises:

identifying, determining, or updating physical data of an interconnect of a partial physical design of the electronic circuit design;

characterizing an electrical parasitic that is associated with the physical data of the interconnect;

providing electro-migration information for the interconnect, while the interconnect is being implemented, to a physical implementation tool to implement the interconnect in the partial physical design by at least characterizing an electrical characteristic that is associated with the electrical parasitic, wherein the partial physical design represents a layout of the electronic circuit design, and at least one circuit component is absent from a net including the interconnect in the partial physical design representing the layout, wherein the layout does not pass a layout-versus-schematic check with a corresponding schematic design due to absence of the at least one circuit component from the layout; and implementing, at an electro-migration aware design automation module stored at least partially in memory and functioning in conjunction with at least the at least one processor of a computing system, the net including the interconnect at least by applying an adjustment to the interconnect based in part or in whole upon the electro-migration information for the interconnect while saving one or more computing resources when the electro-migration information is determined to violate one or more electro-migration related constraints.

30. The article of manufacture of claim 29, the process further comprising at least one of:

displaying the electrical characteristic associated with the physical data of the interconnect or storing the electrical characteristic in a non-transitory computer readable storage medium;

identifying or determining an electro-migration related constraint that is associated with the electrical characteristic; and ensuring correctness of the physical data or other data that are related to the electro-migration related constraint.

31. The article of manufacture of claim 29, wherein the process for performing the process for characterizing the electrical characteristic that is associated with the electrical parasitic further comprises:

performing simulation on the electronic circuit design at a schematic level; and determining the electrical characteristic by using a solver.

32. The article of manufacture of claim 29, wherein the process for characterizing the electrical characteristic that is associated with the electrical parasitic further comprises:

identifying or generating thermal data and a schematic of the electronic circuit design;

generating a netlist;

specifying one or more simulation parameters or one or more analysis points or corners;

performing a simulation at a schematic level to determine one or more schematic level electrical characteristics; and determining the electrical characteristic at a physical level based at least in part upon the one or more schematic level electrical characteristic and the electrical parasitic using a solver.

33. The article of manufacture of claim 29, wherein the at least one processor programmed for performing the process for characterizing the electrical characteristic that is associated with the electrical parasitic is further programmed for performing the process that comprises:

identifying thermal data for the interconnect;

mapping the electrical characteristic at a physical level to a schematic level electrical characteristic at a schematic level;

reducing the electrical parasitic; and specifying one or more simulation parameters or one or more analysis points or corners.

34. A computer implemented method for implementing an electronic circuit design with electro-migration awareness, comprising:

using at least one processor that is programmed for performing a process comprising:

identifying, determining, or updating physical data of a interconnect of a partial physical design of the electronic circuit design;

characterizing an electrical parasitic that is associated with the physical data of the interconnect providing electro-migration information, while the interconnect is being implemented in the partial physical design, to a physical design implementation tool by at least characterizing an electrical characteristic that is associated with the electrical parasitic, wherein the partial physical design represents a layout of the electronic circuit design, and at least one circuit component is absent from a net including the interconnect in the partial physical design representing the layout, wherein the layout does not pass a layout-versus-schematic check with a corresponding schematic design due to absence of the at least one circuit component from the layout; and implementing, at an electro-migration aware design automation module stored at least partially in memory and functioning in conjunction with at least the at least one processor of a computing system, the net including the interconnect at least by applying an adjustment to the interconnect based in part or in whole upon the electro-migration information for the interconnect while saving one or more computing resources when the electro-migration information is determined to violate one or more electro-migration related constraints.

35. The computer implemented method of claim 34, the process further comprising:

identifying or determining an electro-migration related constraint that is associated with the electrical characteristic.

36. The computer implemented method of claim 34, wherein the act of characterizing the electrical characteristic that is associated with the electrical parasitic comprises:

performing simulation on the electronic circuit design at a schematic level;

creating a net on the partial physical design; and determining the electrical characteristic by using a solver.

37. The computer implemented method of claim 34, in which the partial physical design comprises only one or more nets and does not pass a layout versus schematic check or verification.

38. The computer implemented method of claim 34, in which the act of characterizing the electrical parasitic or the act of characterizing the electrical characteristic is performed before creation of a net.

39. The computer implemented method of claim 34, further comprising:

verifying the electrical characteristic after completion of creation or modification of a net or a partial net and before creation or modification of a second net in the partial physical design.

40. A system for implementing an electronic circuit design with electro-migration awareness, comprising:
at least one processor that is to:
identify, determine, or update physical data of a interconnect of a partial physical design of the electronic circuit design;
characterize an electrical parasitic that is associated with the physical data of the interconnect;
provide electro-migration information, while the interconnect is being implemented in the partial physical design, to a the physical design implementation tool by at least characterizing an electrical characteristic that is associated with the electrical parasitic, wherein
the partial physical design represents a layout of the electronic circuit design, and at least one circuit component circuit component is absent from a net including the interconnect in the partial physical design representing the layout, wherein the layout does not pass a layout-versus-schematic check with a corresponding schematic design due to absence of the at least one circuit component from the layout; and
implement, at an electro-migration aware design automation module stored at least partially in memory and functioning in conjunction with at least the at least one processor of a computing system, the net including the interconnect at least by applying an adjustment to the interconnect based in part or in whole upon the electro-migration information for the interconnect while saving one or more computing resources when the electro-migration information is determined to violate one or more electro-migration related constraints.

41. The system of claim 40, the at least one processor is further to:
identify or determine an electro-migration related constraint that is associated with the electrical characteristic.

42. The system of claim 40, wherein the at least one processor that is to characterize the electrical characteristic that is associated with the electrical parasitic is further to:
perform simulation on the electronic circuit design at a schematic level;
create a net on the partial physical design; and
determine the electrical characteristic by using a solver.

43. The system of claim 40, in which the partial physical design comprises only one or more nets and does not pass a layout versus schematic check or verification.

44. The system of claim 40, in which the at least one processor characterizes the electrical parasitic or characterizes the electrical characteristic before creation of a net.

45. The system of claim 40, wherein the at least one processor is further to:
verify the electrical characteristic after completion of creation or modification of a net or a partial net and before creation or modification of a second net in the partial physical design.

46. An article of manufacture comprising a non-transitory computer readable medium having stored thereupon a sequence of instructions which, when executed by at least one processor, causes the processor to execute a method for implementing an electronic circuit design with electro-migration awareness, the method comprising:
using at least one processor that is programmed for performing a process comprising:
identifying, determining, or updating physical data of a interconnect of a partial physical design of the electronic circuit design;
characterizing an electrical parasitic that is associated with the physical data of the interconnect;
providing electro-migration information, while the interconnect is being implemented in the partial physical design, to a the physical design implementation tool by at least characterizing an electrical characteristic that is associated with the electrical parasitic, wherein
the partial physical design represents a layout of the electronic circuit design, and at least one circuit component circuit component is absent from a net including the interconnect in the partial physical design representing the layout, wherein the layout does not pass a layout-versus-schematic check with a corresponding schematic design due to absence of the at least one circuit component from the layout; and
implementing, at an electro-migration aware design automation module stored at least partially in memory and functioning in conjunction with at least the at least one processor of a computing system, the net including the interconnect at least by applying an adjustment to the interconnect based in part or in whole upon the electro-migration information for the interconnect while saving one or more computing resources when the electro-migration information is determined to violate one or more electro-migration related constraints.

47. The article of manufacture of claim 46, the process further comprising:
identifying or determining an electro-migration related constraint that is associated with the electrical characteristic.

48. The article of manufacture of claim 46, wherein the act of characterizing the electrical characteristic that is associated with the electrical parasitic comprises:
performing simulation on the electronic circuit design at a schematic level;
creating a net on the partial physical design; and
determining the electrical characteristic by using a solver.

49. The article of manufacture of claim 46, in which the partial physical design comprises only one or more nets and does not pass a layout versus schematic check or verification.

50. The article of manufacture of claim 46, in which the act of characterizing the electrical parasitic or the act of characterizing the electrical characteristic is performed before creation of a net.

51. The computer implemented method of claim 46, further comprising:
verifying the electrical characteristic after completion of creation or modification of a net or a partial net and before creation or modification of a second net in the partial physical design.

* * * * *